(12) United States Patent
Rosenbluth et al.

(10) Patent No.: US 6,563,566 B2
(45) Date of Patent: May 13, 2003

(54) SYSTEM AND METHOD FOR PRINTING SEMICONDUCTOR PATTERNS USING AN OPTIMIZED ILLUMINATION AND RETICLE

(75) Inventors: Alan E. Rosenbluth, Yorktown Heights, NY (US); Scott Josef Bukofsky, Hopewell Junction, NY (US); Alfred K. K. Wong, Pokfulam (HK)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/771,793

(22) Filed: Jan. 29, 2001

(65) Prior Publication Data

US 2002/0140920 A1 Oct. 3, 2002

(51) Int. Cl.[7] ........................ G03B 27/54; G03B 27/32; G03C 5/00; A61N 5/00; G21K 5/10
(52) U.S. Cl. ...................... 355/67; 355/55; 355/77; 430/311; 430/312; 430/323; 250/492.2; 250/492.22
(58) Field of Search ............................. 355/67, 55, 77; 430/311, 312, 323; 250/492.2, 492.22

(56) References Cited

U.S. PATENT DOCUMENTS

| | | | |
|---|---|---|---|
| 4,037,969 A | * | 7/1977 | Feldman et al. |
| 4,326,805 A | * | 4/1982 | Feldman et al. |
| 5,208,629 A | | 5/1993 | Matsuo et al. |
| 5,328,785 A | | 7/1994 | Smith et al. |
| 5,446,587 A | | 8/1995 | Kang et al. |
| 5,447,810 A | | 9/1995 | Chen et al. |
| 5,482,801 A | | 1/1996 | Smith et al. |
| 5,501,925 A | | 3/1996 | Smith et al. |
| 5,680,588 A | | 10/1997 | Gortych et al. |
| 5,698,347 A | | 12/1997 | Bae |
| 5,807,649 A | | 9/1998 | Liebmann et al. |
| 5,851,701 A | * | 12/1998 | Rolson |
| 5,973,767 A | | 10/1999 | Pasch |
| 6,067,375 A | * | 5/2000 | Tsudaka |
| 6,333,129 B2 | * | 12/2001 | Kim et al. |
| 6,226,074 B1 | * | 5/2002 | Fujisawa et al. |

OTHER PUBLICATIONS

Imaging characteristics of Multi–phase–shifting and Half-tone Phase–shifting Masks, Terasawa et al. Japanese Journal of Applied Physics, vol. 30, No. 11B, Nov. 1991, pp. 2991–2997.
New Phase Shifting Mask with Self–aligned Phase Shifters for a Quarter Micron Photolithography, Nitayama et al. IEDM 89 pp. 57–60.

(List continued on next page.)

Primary Examiner—Russell Adams
Assistant Examiner—Khaled Brown
(74) Attorney, Agent, or Firm—Todd M. C. Li

(57) ABSTRACT

A system and method is described for lithographically printing patterns on a semiconductor using combinations of illumination and mask patterns which are optimized together to produce the desired pattern. The method of optimizing both illumination and mask pattern allows the development of mask patterns that are not constrained by the geometry of the desired pattern to be printed. Thus, the method provides high quality images even when the desired printed patterns have critical dimensions that approach the resolution limits of a lithographic system. The resulting mask patterns using the method do not obviously correspond to the desired patterns to be printed. Such masks may include phase-shifting technology that use destructive interference to define dark areas of the image and are not constrained to conform to the desired printed pattern.

43 Claims, 12 Drawing Sheets

OTHER PUBLICATIONS

Improving Resolution in Photolithography with a Phase–Shifting Mask, Levenson et al. IEEE Transactions on Electron Devices vol ED–29, No. 12, Dec. 1982, pp. 1828–1836.

New Imaging Technique for 64M–DRAM, Shiraishi et al. SPIE vol. 1674 Optical/Laser Microlithography V (1992) pp. 741–752.

Subhalf Micron Lithography System with Phase–Shifting Effect, Noguchi et al. SPIE vol. 1674 Optical/Laser Microlithography V (1992), pp. 92–104.

Data Analysis Methods for Evaluating Lithographic Performance, Ferguson et al. J. Vac. Sci. Technol. B 15(6), Nov./Dec. 1997, pp. 2387–2393.

* cited by examiner

SYSTEM AND METHOD FOR PRINTING SEMICONDUCTOR PATTERNS USING AN OPTIMIZED ILLUMINATION AND RETICLE

FIELD OF THE INVENTION

The present invention relates generally to lithographic printing of features for forming integrated circuit (IC) patterns on a semiconductor chip, and more particularly to a method for selecting and using combinations of illumination source characteristics and diffracting shapes on a reticle mask in order to project and print an image on a semiconductor wafer that substantially matches the shape of the desired IC patterns with minimal distortion.

BACKGROUND OF THE INVENTION

Many methods have been developed to compensate for the image degradation that occurs when the resolution of optical lithography systems approaches the critical dimensions (CD's) of desired lithographic patterns that are used to form devices and integrated circuits (IC's) on a semiconductor chip. Critical dimension (CD) refers to the feature size and spacing between features and feature repeats (pitch) that are required by the design specifications and are critical for the proper functioning of the devices on a chip. When the CD's of a desired IC pattern approach the resolution of a lithographic system (defined as the smallest dimensions that can be reliably printed by the system), image distortions becomes a significant problem. Today the limited resolution of lithography tools poses a key technical challenge in IC manufacture, and this difficulty will increase in the future as critical dimensions become increasingly smaller. In order to make the manufacture of future IC products feasible, lithography tools will be required to achieve adequate image fidelity when the ratio of minimum CD to resolution of the lithographic system is very low.

The resolution ρ of a lithographic system can be described by the equation:

$$\rho = \frac{k\lambda}{NA}, \qquad [1]$$

where ρ is the minimum feature size that can be lithographically printed, NA (numerical aperture) is a measure of the amount of light that can be collected by the lens, and λ is the wavelength of the source light. This equation expresses the concept that the smallest feature size that can be printed is proportional to the wavelength of the light source, and that the image fidelity is improved as diffracted light is collected by the lens over a wider range of directions. Although a larger NA permits smaller features to be printed, in practice NA is limited by depth-of-focus requirements, by polarization and thin-film effects, and by difficulties in lens design. The so-called k-factor represents aspects of the lithographic process other than wavelength or numerical aperture, such as resist properties or the use of enhanced masks. Typical k-factor values in the prior art range from about 0.7 to 0.4. Because of limitations in reducing wavelength λ or increasing numerical aperture NA, the manufacture of future IC products having very small CD's will require reducing the k-factor, for example, to the range 0.3–0.4 or smaller, in order to improve the resolution of the lithographic processes.

The basic components of a projection lithographic system are illustrated in FIG. 1. An illumination source 110 provides radiation that illuminates a mask 120, also known as a reticle; the terms mask and reticle may be used interchangeably. The reticle 120 includes features that act to diffract the illuminating radiation through a lens 140 which projects an image onto an image plane, for example, a semiconductor wafer 150. The aggregate amount of radiation transmitted from the reticle 120 to the lens 140 may be controlled by a pupil 130. The illumination source 110 may be capable of controlling various source parameters such as direction and intensity. The wafer 150 typically includes a photoactive material (known as a resist). When the resist is exposed to the projected image, the developed features closely conform to the desired pattern of features required for the desired IC circuit and devices.

The pattern of features on the reticle 120 acts as a diffracting structure analogous to a diffraction grating which transmits radiation patterns that may interfere constructively or destructively. This pattern of constructive and destructive interference can be conveniently described in terms of a Fourier transform in space based on spacing of the features of the diffraction grating (or reticle 120). The Fourier components of diffracted energy associated with the spatial frequencies of the diffracting structure are known in the art as diffracted orders. For example, the zeroth order is associated with the DC component, but higher orders are related to the wavelength of the illuminating radiation and inversely related to the spacing (known as pitch) between repeating diffracting features. When the pitch of features is smaller, the angle of diffraction is larger, so that higher diffracted orders will be diffracted at angles larger than the numerical aperture of the lens.

A diagram can be constructed in direction space to indicate the diffracted orders that can be collected by a lithographic system that is based on repeating dimensions of a desired pattern. For example, the pattern illustrated in FIG. 4 can be represented by a unit cell as in FIG. 2. The pattern has a horizontal repeat dimension 203, and a staggered pitch indicated by the diagonal repeat dimension 205 (alternatively indicated by the vertical pitch 201). Assuming that this unit cell is repeated in a diffraction grating and illuminated by an on-axis beam, the diffracted orders can be illustrated in direction space as indicated in FIG. 3. The position of a diffracted order (points 300–326) is plotted as the projection of the beam diffracted at an angle θ from the on-axis beam. The distance of a non-zero order from the center of the direction space diagram 300 (which represents the position of the zeroth order and is also the direction of the on-axis beam) is plotted as the sine of θ which is the ratio of the wavelength of the illumination divided by the repeat distance. For example, the +2 order represented by the horizontal repeat distance 203 is represented by the point 301 and the −2 order is represented by the point 310. Similarly, points 305 and 319 represent the +2 and −2 orders based on the vertical repeat distance 201. Other orders are diffracted both horizontally and vertically, such as order 308, denoted as the {−1, +1} order. For reference, the numerical aperture (NA) 350 of the lens is also plotted. The only orders collected by the lens are 300, 301, 310, 303, 308, 313, and 312. Note that the amplitudes of a wave front diffracted by a reticle will be dependent on both the illumination amplitude and the diffractive properties of the mask.

Off-axis illumination has been known in the art as a technique used to improve resolution. Although off-axis illumination causes asymmetry in the projected image, the asymmetry caused by the off-axis illumination can be corrected by illuminating from mirrored directions. This technique is often used in the prior art, for example, by using an annular source configuration.

The intensity contours of light projected by the lens can depart significantly in shape from those of the input mask pattern. Two dimensional (2D) patterns have multiple critical dimensions that must be met, thus exacerbating the problem of achieving image fidelity. Moreover, with all but the simplest shapes, the errors in the different critical dimensions that comprise the printed pattern are unequal, making it impossible to correct the errors with an exposure adjustment. Quite often such unequal dimensional distortions fall into the broad category of "line-shortening". For example, patterns such as in FIG. 4 (for example, an isolation level of a dynamic random access memory (DRAM) design) or as in FIG. 14 (for example, the capacitor level of a DRAM design) are prone to line-shortening. In the pattern of FIG. 4, the rectangular features, have width 401 equal to the basic dimensional unit of the cell F. The rectangular features represent regions where photoactive material (resist) should be retained after the printed pattern is developed. The vertical spacing 402 is also equal to F, and the length 405 is equal to 6.5 F. The desired horizontal spacing 408 between the tips of the rectangles is 1.5 F. However, when the k-factor is small, the contrast across the tips is small, and in order to adequately resolve the tips of the rectangles, it is necessary to print the rectangles at a length shorter than the desired 6.5 F.

In addition, at small k-factor, the low contrast of the projected images magnifies the dimensional errors that arise from random variations in the patterning process. This can cause prohibitive sensitivities to such imperfections as non-uniform substrate reflectivity, mask dimensional inaccuracy, illumination nonuniformity, defocus, stray light, and residual lens aberrations.

Many methods have been developed to reduce these problems. A summary of these prior art methods is briefly described below.

Many enhancement techniques adjust the shapes of mask features to compensate the distortions that arise at small k-factor, as discussed in L. W. Liebmann et al., "Optical proximity correction: a first look at manufacturability," in SPIE Proceedings, Vol. 2322— 14th Annual Symposium on Photomask Technology and Management, (Society of Photo-Optical Instrumentation Engineers, 1994), pages 229–238. The technique of altering the reticle mask shapes (for example, by widening the mask shapes at the tips of line features, or by lengthening the features) is referred to as biasing. For example, FIG. 4A illustrates a mask biased with hammerhead shapes 420 to compensate for line-shortening of the pattern in FIG. 4. In some cases, however, this not only fails to address the problem of poor contrast, it actually exacerbates it, i.e. biasing mask features can actually degrade contrast to the point of being counterproductive. In cases such as the pattern in FIG. 4, the contrast across the tips is poor even when the rectangles print with considerable shortening; i.e. considerable light spills between adjacent tips in the blurred image, even though shortening draws the tips apart. When the mask rectangles are biased with hammerhead shapes 420 as in FIG. 4A in order to compensate for line-shortening, the contrast in the gaps of the image degrades further because poorly resolved light from the hammerheads 420 spills into gaps 409. Contrast in the gaps 409 is similarly degraded if the mask rectangles are lengthened in an effort to compensate for line shortening in the printed patterns, because blurring is worse when the separating gaps are biased to be narrower.

Computer algorithms are known which can provide appropriate adjustment of mask shapes to compromise between such conflicting effects (see, for example, O. W. Otto et al., "Automated optical proximity correction—a rules-based approach," in SPIE Proceedings, Vol. 2197— Optical Microlithography VII (Society of Photo-Optical Instrumentation Engineers, 1994), pages 278–293). However, these algorithms are only able to provide a very limited benefit when different aspects of image quality require that the shapes be perturbed in opposite directions, as with line shortening. In general, image enhancement techniques work poorly when geometric constraints that are inherent to the desired circuit pattern yield contradictory requirements for optimizing the shape and/or position of these patterns on the mask. For example, the close packing of patterns such as in FIG. 4 or FIG. 14 causes an intrinsic loss in contrast when mask features are biased to achieve the desired critical dimensions (CD's) of the desired image.

Another class of enhancement techniques improves contrast in the image by shifting the phase of the light projected from the mask. This does not directly address the above-mentioned intrinsic geometric conflicts in certain circuit patterns, but it does reduce their severity by reducing image blur. One source of image blur is caused by the limited resolution of lithography lenses, which washes out the sharp transition in transmittance between mask features, blurring it over a distance defined by the lens resolution.

One enhancement technique (known as "phase-shifting chrome" or "attenuated phase shift") improves image sharpness by augmenting the rate of change in illumination amplitude across the edge of mask features. This is achieved by using phase-shifting material of slightly negative transmittance for dark areas of the pattern, rather than the conventional material of zero transmittance, for example, as described in T. Terasawa et al., "Imaging characteristics of multi-phase-shifting and halftone phase-shifting masks," Japanese J. Appl. Phys. Part 1, Vol. 30, no.11B (1991), pages 2991–2997. Phase shifting increases the slope of illumination intensity at the edges of image features since the transmitted electric field makes a transition (see, for example electric field amplitude 160 in FIG. 1A) from unity to a value less than zero (see, for example electric field amplitude 160 in the dark region 199 in FIG. 1A); the slope in the image intensity across the edge of features in the image is increased accordingly. However, the steepness of the slope across the edges of image features is limited by the requirement that the negative electric field amplitude 160 transmitted to areas of the image that are intended to be dark areas 199 not have sufficient intensity 170 to print the dark areas 199 (FIG. 1A) as if they were bright areas 190. (For purposes of discussion, it is hereafter assumed that the photoresist is a positive resist, which is most commonly used in the art. In the case of a negative resist, dark image areas would be substituted for bright areas and vice versa.) Thus, while phase shifting improves contrast, the improvement can be inadequate in certain cases. As previously discussed, certain patterns are limited by intrinsic geometric constraints in which correction of dimensional errors can only be made at the expense of degraded contrast. Phase-shifting reduces the impact of these pattern conflicts, but does not eliminate them. The same conclusion applies when negative electric field amplitude is provided by a thin rim of transparent phase shifting material as discussed in A. Nitayama et al., "New phase-shifting mask with self-aligned phase shifters for quarter micron photolithography," in 1989 International Electron Devices Meeting—Technical Digest (Cat. 89CH2637-7) (Washington, D.C.: IEEE, 1989), pages 57–60.

The so-called alternating-phase-shift technique (for example, as discussed in M. D. Levenson, N. S. Viswanathan, and R. A. Simpson, "Improving Resolution in Photolithography with a Phase-Shifting Mask," IEEE Transactions on Electron Devices, Vol. ED-29, no. 12 (1982), pages 1828–1836) achieves further contrast improvement by successively shifting the phase of adjacent bright features between 0° and 180°. In this way the contrast of illumination intensity across the edge of image features is further increased in comparison to either conventional masks or phase-shifting chrome. However, as with phase-shifting chrome, the alternating-phase-shift technique does not directly address the above-mentioned intrinsic geometric constraints of common 2D patterns, though it can further reduce their severity. In addition, with some 2D circuit layouts it is impossible to tile every mask feature with a phase that is opposite to the phase of all neighboring features, meaning that lithographic performance will be gated by the unimproved transitions that separate features having the same phase.

Moreover, the alternating-phase-shift technique often adds unwanted features to image patterns. This occurs when circuit shapes are laid out in such a way that the desired alternation in phase can only be achieved by introducing artificial 0° to 180° mask transitions which print as unwanted patterns. For example, when opposite phases are applied to bright regions that pass in close proximity to one another at a certain point on the mask, the phase must make such an unwanted transition if the bright regions are connected together elsewhere in the mask pattern. Such unwanted phase transitions will print as a dark fringe within the nominally bright connecting area, and must be trimmed away using a second exposure. It has also been suggested that unwanted mask transitions might be blunted below the threshold of printability through use of intermediate-phased regions, grading the transition in stages from 0° to 180° along the connecting regions. However, this gives rise to a phase tilt along the mask, which in turn causes very strong shifting of the image when focus fluctuates. For this reason intermediate phases are not often employed.

It is known that the benefits of a continuously varying phase can sometimes be achieved by tilting the light beam which illuminates the mask (for example, see N. Shiraishi et al., "New imaging technique for 64M DRAM," in SPIE Proceedings, Vol. 1674—Optical Microlithography V (Society of Photo-Optical Instrumentation Engineers, 1992), pages 741–752; M. Noguchi et al., "Sub-half-micron lithography system with phase-shifting effect," in SPIE Proceedings Vol.1674—Optical Microlithography V (Society of Photo-Optical Instrumentation Engineers, 1992), pages 92–104). With many patterns the tilt can be adjusted in such a way that the change in tilt phase along the mask causes the illumination at successive critical features to alternate between positive and negative phase. Moreover, where successive features are connected by orthogonal shapes, the phase makes a smooth transition from 0° to 180° along these connecting shapes. The above-mentioned focus sensitivity which such phase tilts can cause is avoided by illuminating the mask symmetrically from mirrored directions. In lowest order the focus sensitivities from the different directions then cancel.

Methods are known for selecting the illumination directions incident on a given mask in ways that maximize the slope of image features, and that minimize CD nonuniformity between different features through superposition of multiple illumination directions (for example, see U.S. Pat. No. 5,680,588 entitled "Method and system for optimizing illumination in an optical photolithography projection imaging system" issued to A. E. Rosenbluth and J. Gortych on Oct. 21, 1997). This is referred to as "source optimization".

However, as with the image enhancement techniques described above, the benefit from optimizing the illumination in this way is limited. The optimized source achieves CD uniformity by balancing the differing bias effects of multiple illumination directions. Unfortunately, when bias effects are severe, for example when the geometric constraints of the pattern result in line shortening, such balancing usually requires contributions from image components produced by particular illumination directions that have low contrast.

Accordingly, there is a need for a technique for enhancing image quality that is not so strongly limited by the intrinsic geometric constraints of the pattern layout.

SUMMARY OF THE INVENTION

It is an object of the present invention to provide a method for optimally choosing illumination distribution and reticle mask features so that the number of adjustable degrees of freedom per resolution element is significantly increased.

It is a further object of the present invention to significantly reduce phenomena, such as line shortening, that are due to constraints inherent in the geometry of the desired wafer patterns.

It is a further object of the present invention to obtain optimal combinations of illumination and mask patterns without requiring that diffracted wave fronts collected by the lens be constrained to be symmetrical.

It is a further object of the present invention to obtain optimal mask patterns that are not constrained to conform to the basic layout of the desired target wafer patterns.

The present invention addresses the above-described objectives by providing a method for obtaining an optimal combination of source illumination and reticle mask features that are chosen such that resulting image is optimized in accordance with a user-specified merit function and constraints.

According to a first aspect of the invention, a merit function is chosen to describe a relationship between source parameters, reticle features or parameters, and desired image characteristics, and the merit function is optimized subject to user-specified constraints on the resulting image. Source parameters may include, for example, source direction and source intensities. Reticle parameters may be defined, for example, in terms of diffracted amplitudes. Image constraints may include, for example, a predefined intensity at desired image feature edge points, and thresholds defining bright and dark areas of the image. The merit function may include, for example, the gradient of the image perpendicular to the feature edges.

According to another aspect of the present invention, the features of a reticle using a desired mask material, such as phase-shifting chrome, are formed based on a set of optimized diffracted amplitudes in combination with an optimized set of source parameters.

According to another aspect of the present invention, the transmitting or diffracting features of a reticle are formed such that dark areas of the desired image pattern are produced by destructive interference of the diffracted energy. Such a mask may be formed, for example, using a phase-shifting material such as phase-shifting chrome.

Also, according to another aspect of the present invention, a lithographic system is provided that incorporates an optimized combination of source and reticle features, obtained using the method in accordance with the present invention, in order to print a desired pattern.

Also, according to a further aspect of the present invention, a computer program is provided that performs the method of obtaining a combination of source parameters and reticle features such that characteristics of a desired image are optimized in accordance with a merit function.

According to the present invention, a method is described for printing an integrated circuit pattern on a semiconductor wafer having a photoactive material thereon, the method comprising the steps of:

providing a desired wafer feature pattern having at least one wafer feature element;

deriving a merit function describing a relationship between an illumination source, a reticle, and an image, said source having at least one source parameter, said reticle having at least one diffractive feature, and said image having at least one image intensity;

selecting at least one constraint in relation to said desired wafer feature pattern that said at least one image intensity must satisfy;

selecting a combination of said at least one source parameter and said at least one diffractive feature so that said merit function is optimized in accordance with said at least one constraint;

illuminating said reticle with illumination energy from said illumination source, so that said illumination energy is diffracted by said reticle and projected through a lens aperture to form said at least one image intensity on the wafer;

exposing the photoactive material to said at least one image intensity; and developing said exposed photoactive material to form a printed feature, so that said printed feature conforms with said at least one wafer feature element of said desired wafer feature pattern in accordance with said constraints.

Also, according to the present invention, a method is described for selecting a combination of source illumination parameters and diffraction mask features for projecting energy through a lens aperture to form an image pattern on a wafer, the method comprising the steps of:

providing a desired wafer feature pattern having at least one wafer feature element;

deriving a merit function describing a relationship between an illumination source, a reticle, and the image pattern, said source having at least one source source parameter, said reticle having at least one diffractive feature, and said image pattern having at least one image intensity;

selecting at least one constraint in relation to said desired wafer feature pattern that said at least one image intensity must satisfy; and selecting a combination of said at least one source parameter and said at least one diffractive feature, so that said merit function is optimized in accordance with said at least one constraint.

A computer program product according to the present invention is described for selecting a combination of source illumination parameters and diffraction mask features for projecting energy through a lens aperture to form a desired image, the computer program product comprising computer readable instructions for performing a method having the following steps:

causing a computer to store a desired wafer pattern having at least one wafer feature element;

causing the computer to compute a merit function describing a relationship between an illumination source, a reticle, and an image pattern, said source having at least one source source parameter, said reticle having at least one diffractive feature, and said image pattern having at least one image intensity;

storing at least one constraint in relation to said desired wafer feature pattern that said at least one image intensity must satisfy; and selecting a combination of said at least one source parameter and said at least one diffractive feature, so that said merit function is optimized in accordance with said at least one constraint.

Also described, according to the present invention, is a machine readable storage medium having stored therein a program of instructions executable by the machine to perform method steps for selecting a combination of source illumination parameters and diffraction mask features for projecting energy through a lens aperture to form a desired image, said method steps comprising:

storing a desired wafer feature pattern having at least one wafer feature element;

storing instructions for causing a computer to compute a merit function describing a relationship between an illumination source, a reticle, and an image pattern, said source having at least one source source parameter, said reticle having at least one diffractive feature, and said image pattern having at least one image intensity;

storing at least one constraint in relation to said desired feature pattern that said at least one image intensity must satisfy; and selecting a combination of said at least one source parameter and said at least one diffractive feature, so that said merit function is optimized in accordance with said at least one constraint.

According to the present invention, a lithographic system is described for printing a desired wafer feature pattern on a semiconductor wafer including a photoactive material, the system comprising:

an illumination source having at least one source parameter;

a reticle having at least one diffractive feature; and a lens;

said illumination source, said reticle and said lens being arranged so that said source illuminates said reticle so as to produce a plurality of diffracted amplitudes and said plurality of diffracted amplitudes are collected by said lens and projected to form a image on the semiconductor wafer, the image having at least one image intensity and wherein said at least one source parameter and said at least one diffractive feature are selected in accordance with a merit function describing a relationship between said at least one source parameter, said plurality of diffracted amplitudes, and said at least one image intensity and wherein said merit function is optimized in accordance with at least one constraint that said at least one image intensity must satisfy, so that exposing the photoactive material to said at least one image intensity and developing said exposed photoactive material forms at least one printed feature that substantially conforms with the desired wafer feature pattern.

A reticle according to the present invention is described for diffracting illumination energy to form a desired image pattern having a pattern of intensities, the desired image pattern having a bright area in which the intensities within the bright area exceed a predetermined bright threshold and having a dark area in which the intensities within the dark area are less than a predetermined dark threshold, the reticle comprising a pattern of phase-shifting material arranged so that the dark area is formed by destructive interference of diffracted illumination energy. A reticle according to the present invention is also described wherein said phase-shifting material comprises phase-shifting chrome material.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In accordance with the present invention, a method is described for optimally selecting reticles and source illumination for use in optical projection systems, for example, imaging systems of the type used in optical lithography, and a projection imaging system that operates in accordance with such a method.

The present invention exploits the fact that the amplitudes of a wave front diffracted by a reticle will be dependent on both illumination amplitude and the diffractive properties of the mask.

Figure 1:
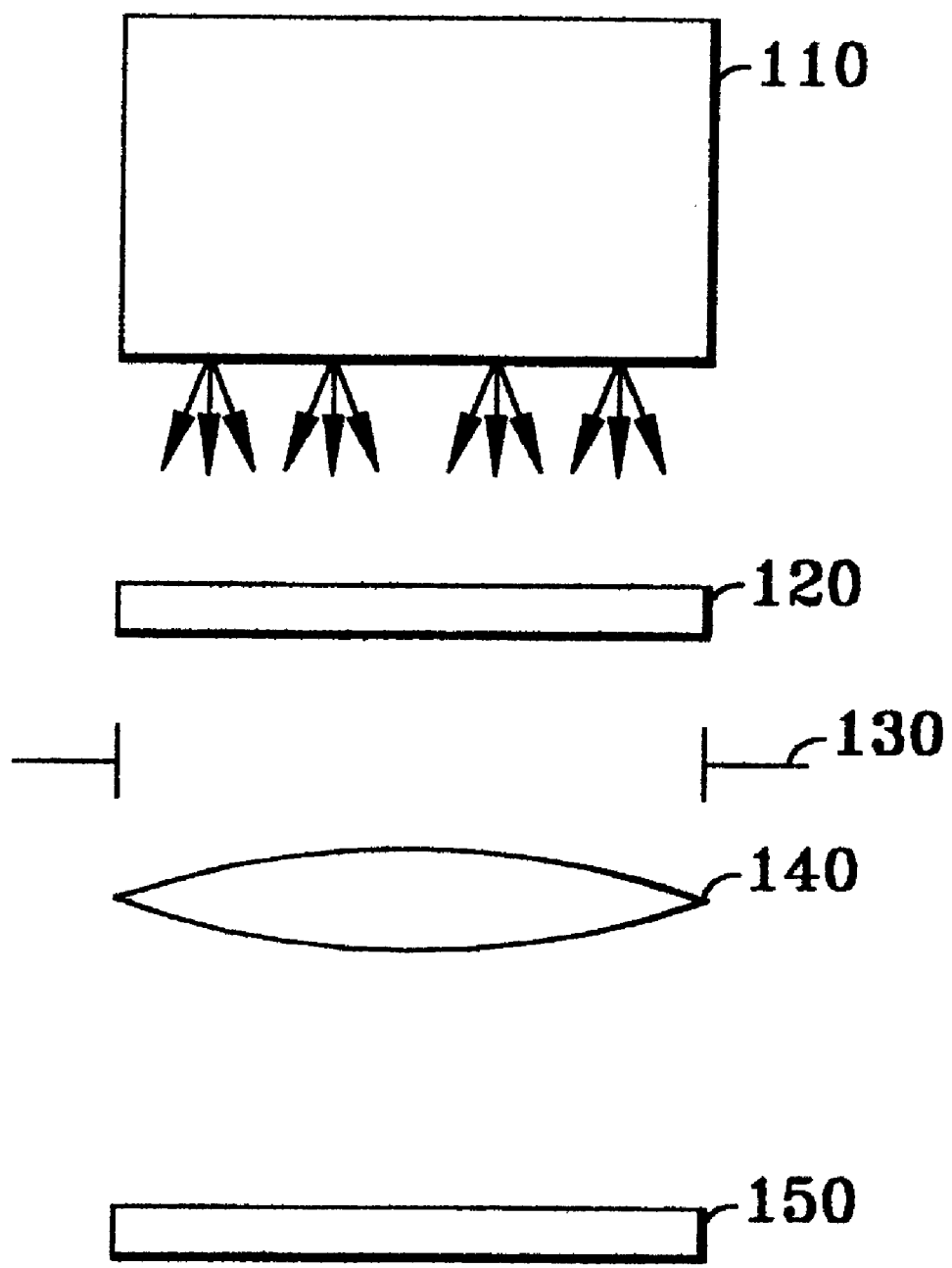
FIG. 1 illustrates key elements of a typical lithographic system as known in the art.
Figure 1A:
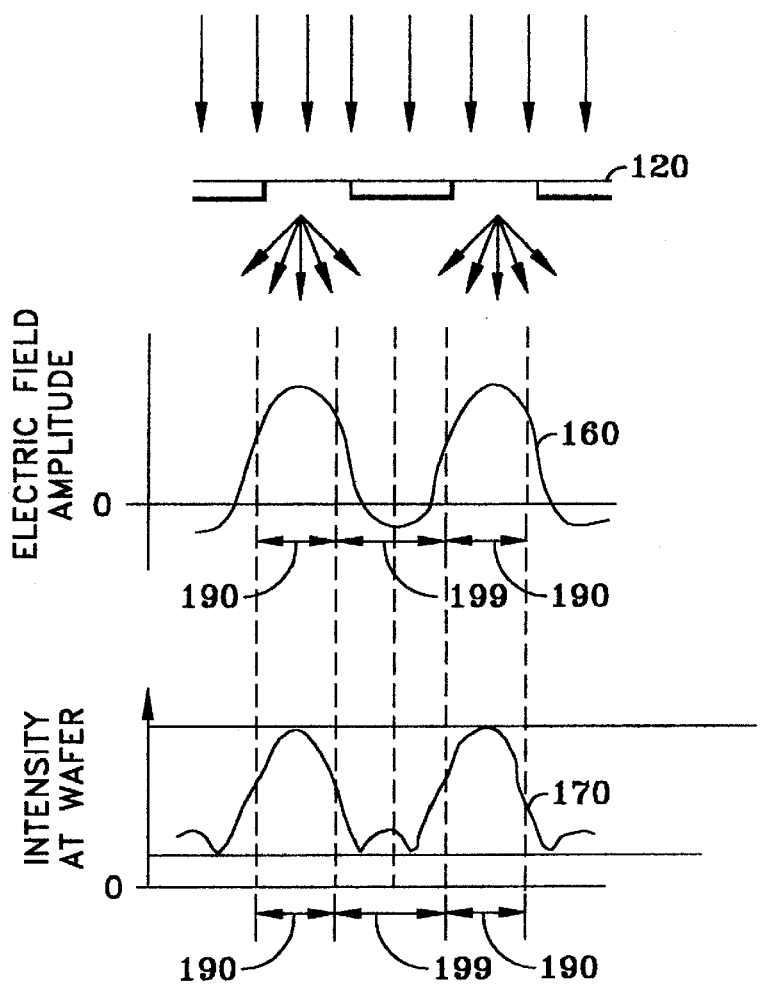
FIG. 1A illustrates the relationship between the electric field amplitude of a diffracted wave front and the intensity at the image plane as known in the art.
Figure 2:
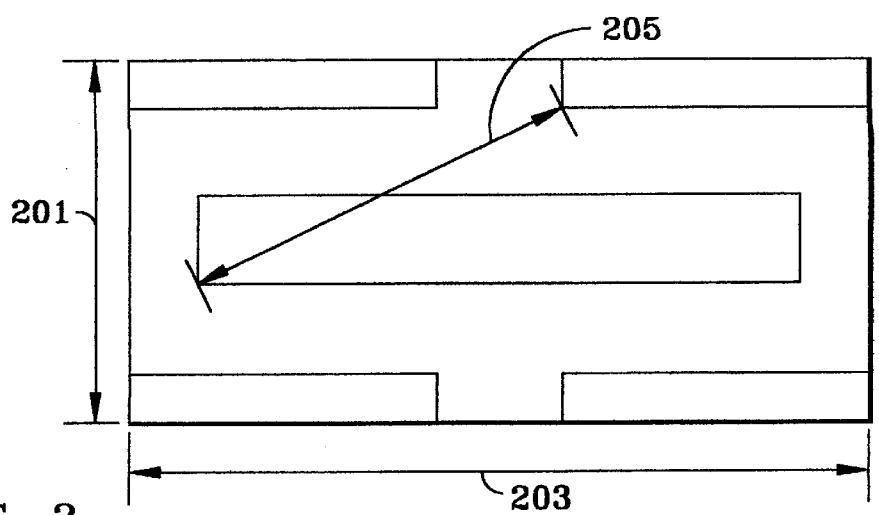
FIG. 2 illustrates the unit cell of a desired image pattern for one embodiment of the present invention.
Figure 3:
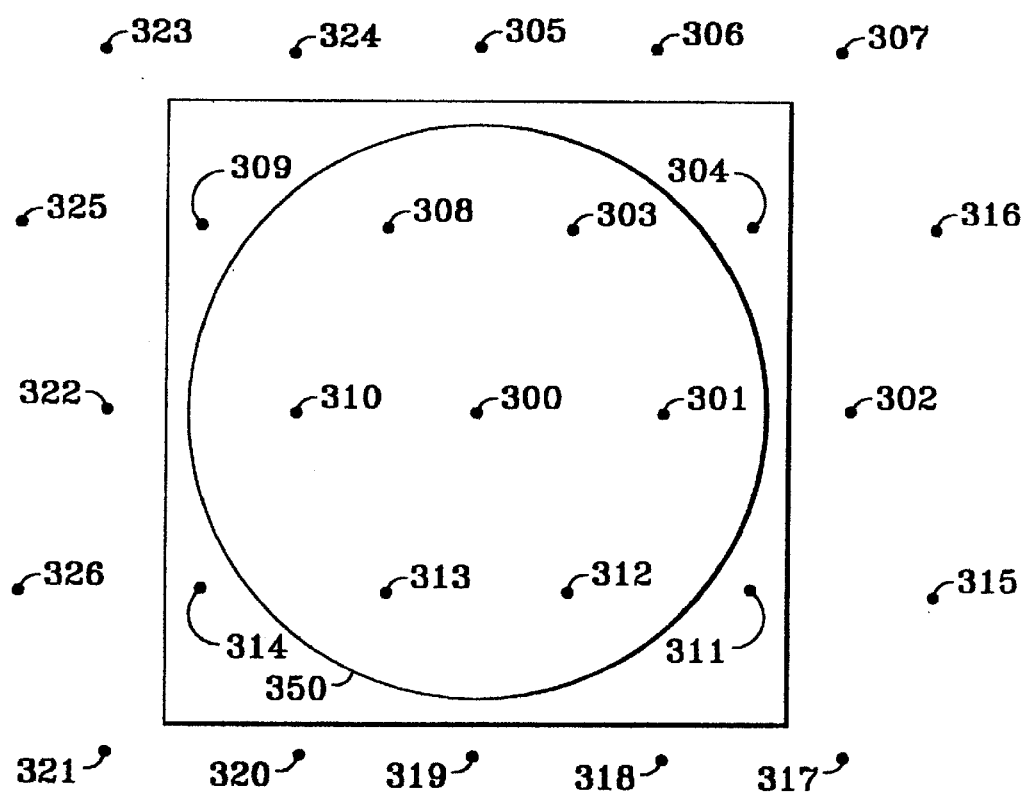
FIG. 3 illustrates collected orders from on-axis illumination for the unit cell of FIG. 2.
Figure 4:
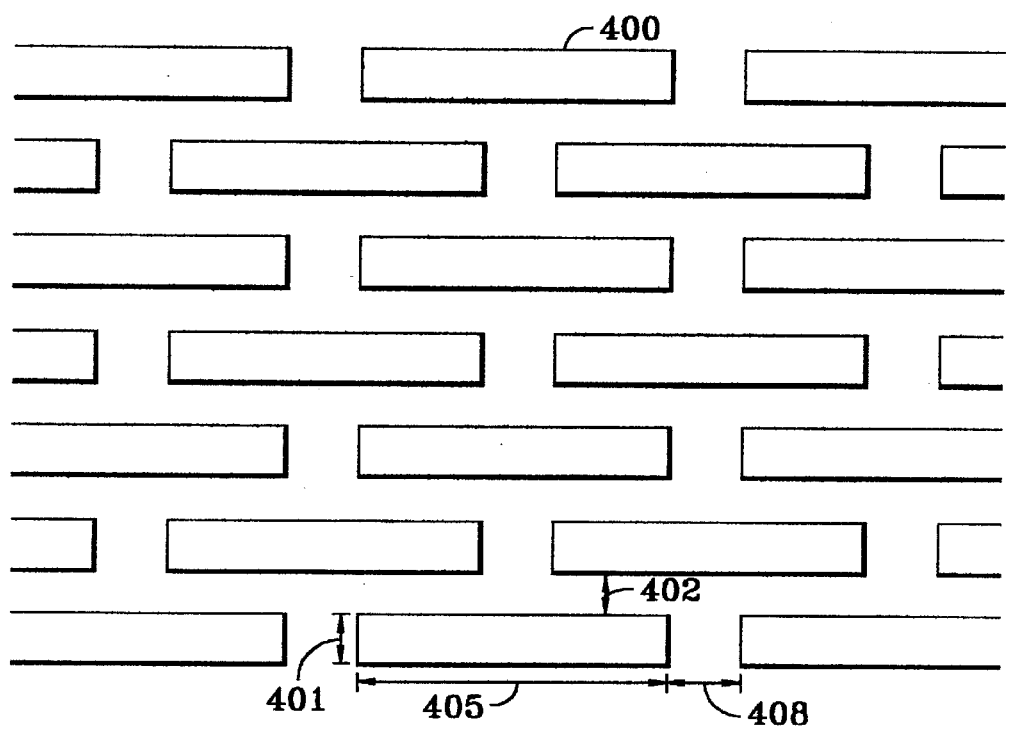
FIG. 4 illustrates a desired wafer feature pattern, for example, at an isolation level.
Figure 4A:
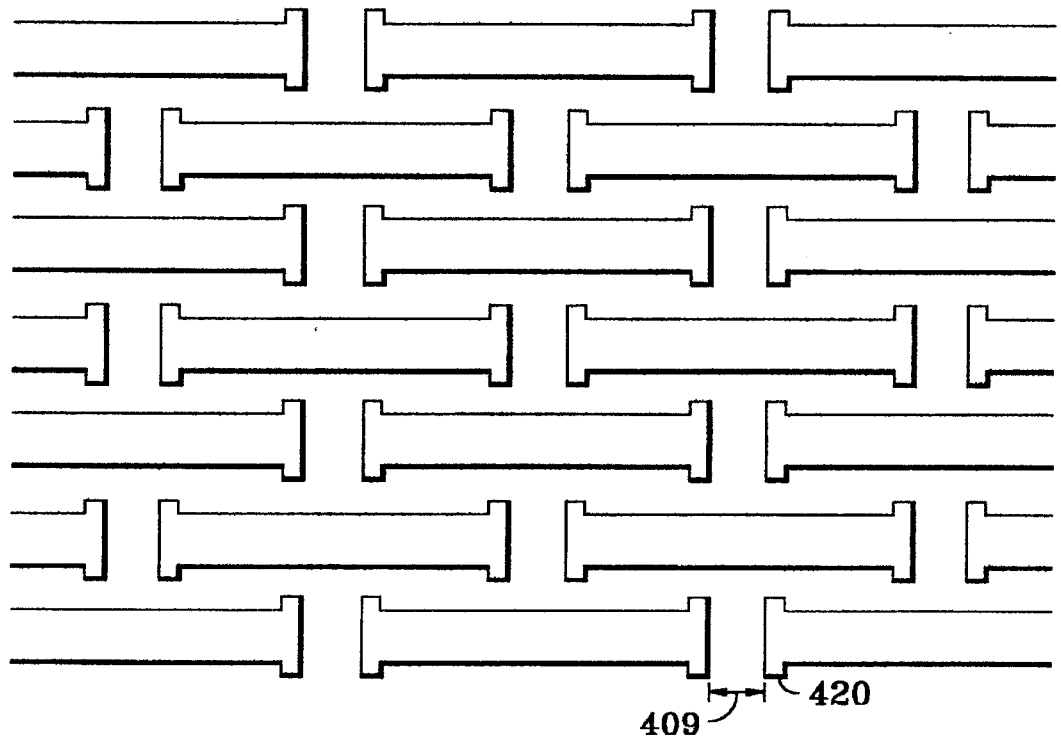
FIG. 4A illustrates a prior art mask using biased shapes to compensate for line-shortening.

Consider again, for example, a desired feature pattern illustrated in FIG. 4 which is represented by a unit cell as in FIG. 2, a horizontal repeat dimension 203, and a staggered pitch indicated by the diagonal repeat dimension 205 (alternatively indicated by the vertical pitch 201). As previously discussed, using this unit cell as a repeated pattern in a diffraction grating and illuminated by an on-axis beam results in diffracted orders which can be plotted in direction space as indicated in FIG. 3. For example, the +2 order represented by the horizontal repeat distance 203 is represented by the point 301 and the −2 order is represented by the point 310. Similarly, points 305 and 319 represent the +2 and −2 orders based on the vertical repeat distance 201. Other orders are diffracted both horizontally and vertically, such as order 308, denoted as the {−1,+1} order. For reference, the numerical aperture (NA) 350 of the lens is also plotted. The only orders collected by the lens are 300, 301, 310, 303, 308, 313, and 312.

It is possible to design a projection system having a combination of illumination amplitudes and mask features such that different orders of the diffracted wave front collected by the lens aperture 350 have amplitudes that are independently adjustable. For example, the amplitude of the collected order 301 can be adjusted independently of order 303.

However, not all of the orders collected can be adjusted independently because of the symmetry of the repeat dimensions. In this example, orders 301 and 310 are constrained to have the same amplitudes. In this example, as in many lithographic patterns, the pattern is bilaterally symmetric about the horizontal and vertical axes, in which case one quadrant of the diffraction pattern essentially determines the other three. Thus, orders 303, 308, 312 and 313 must have the same amplitudes due to the symmetry of the pattern. Therefore, there are really only 3 independent orders collected in the example shown in FIG. 3. Moreover, to avoid strong focus sensitivity it is necessary to restrict the phase of the reticle transmittance to 0° or 180°, making the mask amplitude transmittance a purely real quantity, i.e. non-complex. The real part of the mask diffraction pattern therefore has radially even symmetry and the imaginary part odd symmetry. This means, for example, that order 303 cannot be adjusted independently of order 313, regardless of whether or not the mask patterns are bilaterally symmetric. Other order pairs at equal and opposite radii, such as 308 and 312 or 301 and 310, are constrained in the same way.

Figure 3A:
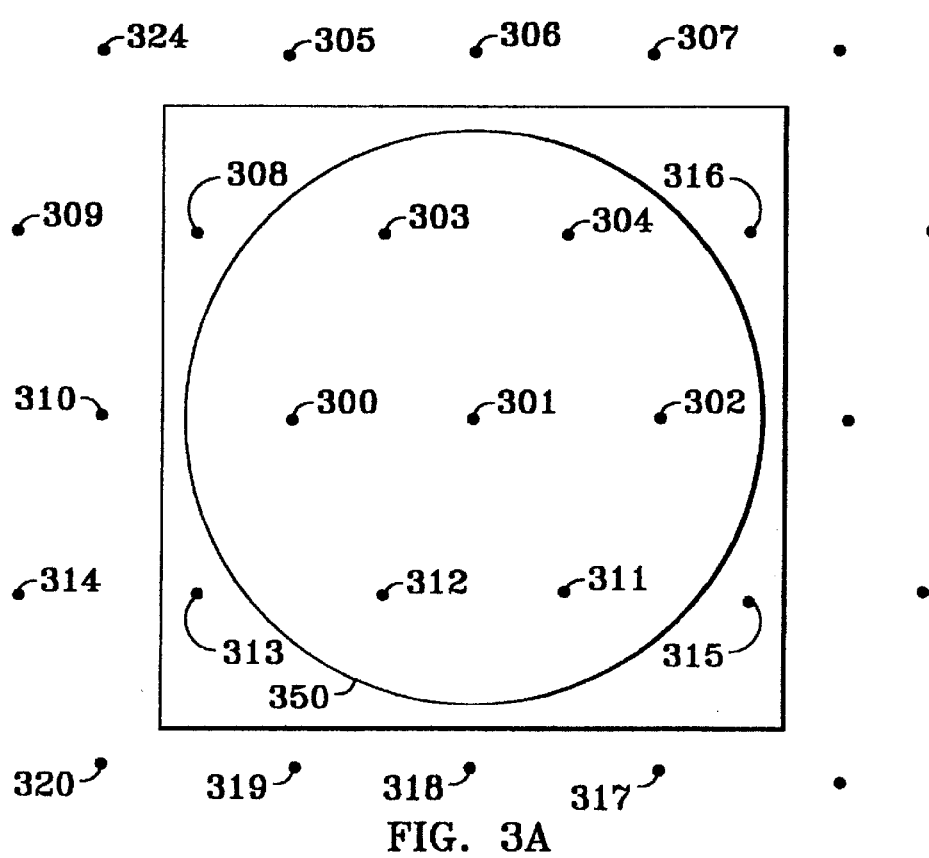
FIG. 3A illustrates collected orders from off-axis illumination for the unit cell of FIG. 2.

On the other hand, if the illumination comes from the 301 direction, then the orders collected will be shifted as shown in FIG. 3A. In this case, there are five independent orders collected, 300, 301, 302, (303 and 312), and (304 and 311), providing an increase in the number of orders that can be independently adjusted. Thus, if illumination comes from the 301 direction, a large number of orders can be independently adjusted. By properly adjusting the illumination direction and the collected orders together, the number of adjustable degrees of freedom in the image can be increased, and improved performance can be achieved over what is known in the art.

Figure 5:
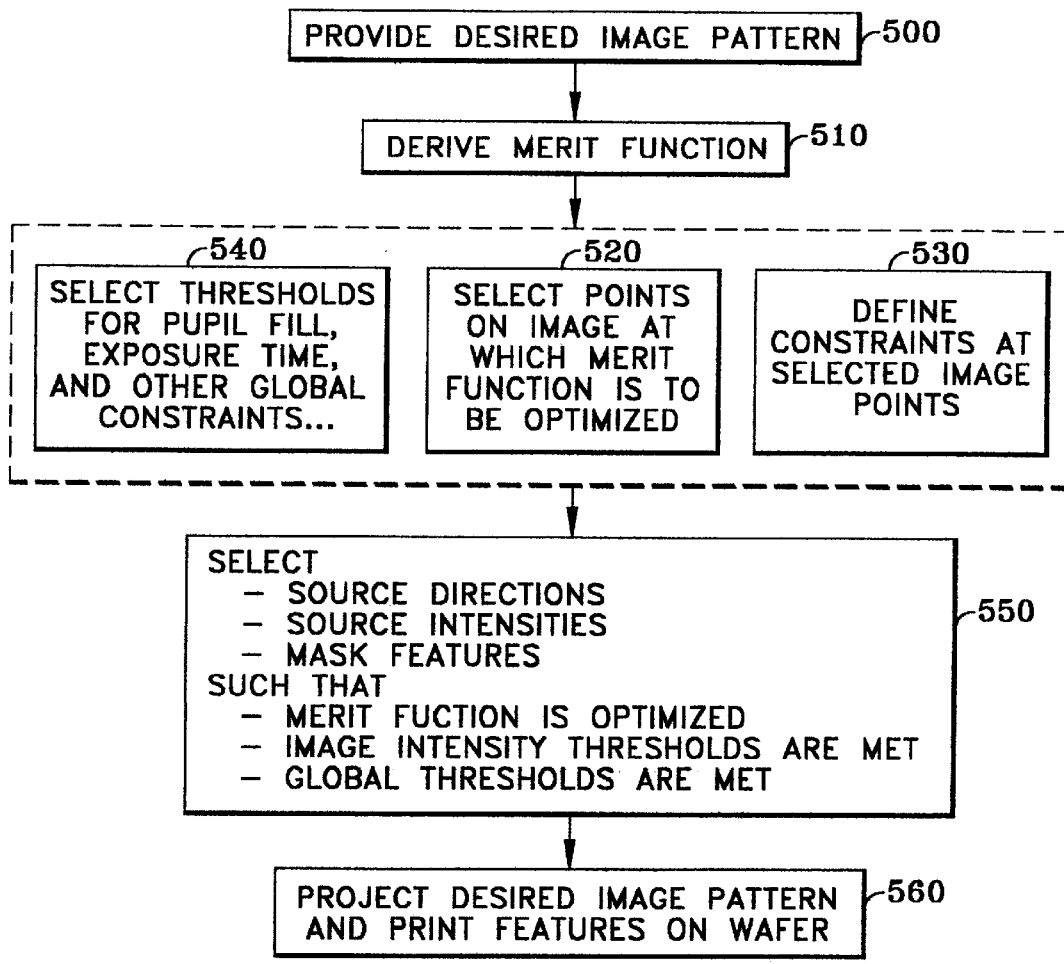
FIG. 5 illustrates a flow chart describing an embodiment of the method for printing a desired wafer pattern in accordance with the present invention.
Figure 6:
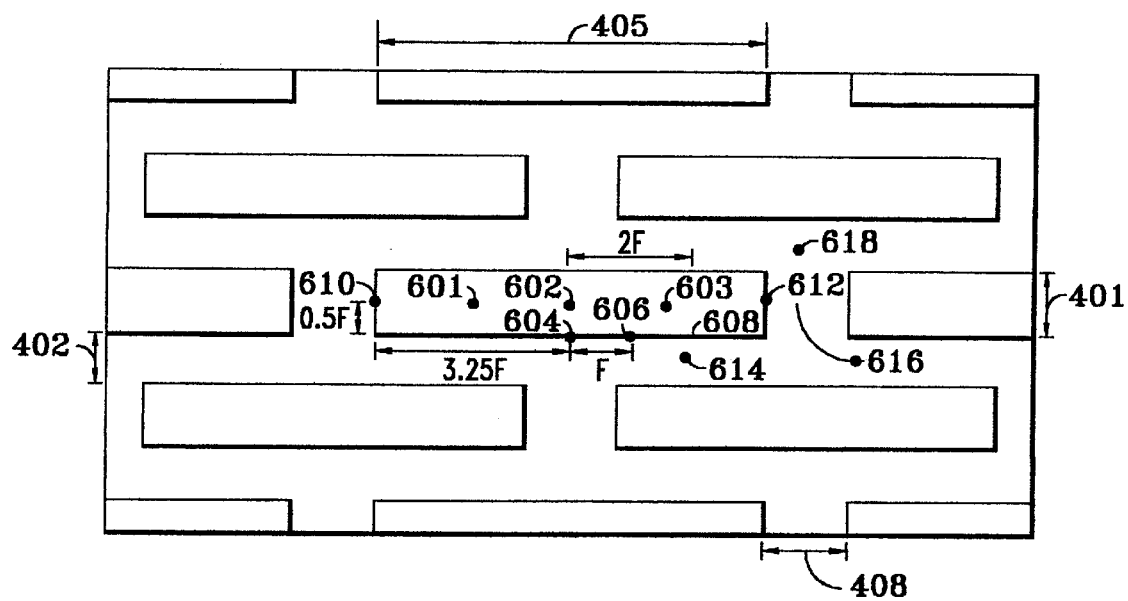
FIG. 6 illustrates a desired feature pattern for one embodiment of the invention, typical for an isolation level.

One embodiment of a method according to the present invention is illustrated in FIG. 5. The method achieves enhancement of the image with respect to a desired IC pattern by simultaneously choosing parameters of source illumination and mask transmission features in a lithographic imaging system so that features of the projected image are optimized as measured by a merit function in accordance with a set of constraints on the image features and lithographic process parameters. The first step 500 consists of providing an desired image pattern, for example, a pattern in which CD is very close to the resolution limits of the lithography system. As an example, for this embodiment, the desired pattern to be printed is illustrated in FIG. 6 (essentially the same as the pattern in FIG. 4), having rectangular features of width 401 equal to the basic dimensional unit of the cell F, and a vertical spacing 402 between the rectangles also equal to F. The length 405 of the rectangular features is equal to 6.5 F. The desired horizontal spacing 408 between the tips of the rectangles is 1.5 F. The next step 510 of the method in accordance with the present invention is to derive a merit function that will be optimized when an appropriate set of source and mask parameters are selected. Considerations in deriving a merit function in this embodiment are discussed in the following paragraphs.

As noted above, to avoid strong focus sensitivity it is desirable that the mask amplitude transmittance be pure real, i.e. the phase of the transmittance should be restricted to 0° or 180°. This means that the real part of the electric field diffracted by the mask will be radially even and the imaginary part will be radially odd. Moreover, lithographic patterns are often bilaterally symmetric about horizontal and vertical axes, in which case one quadrant of the diffraction pattern essentially determines the other three. When the k-factor is sufficiently large, this symmetrical diffraction pattern is simply collected by the lens, and then transferred to the wafer, thereby providing the appropriate symmetry in the image. However, it is not necessary to impose a symmetry constraint on individual collected diffraction orders themselves because the required symmetry can be achieved by using an appropriately selected symmetric source illumination distribution.

A merit function based on the image intensity may be defined in terms of unknown values of source directions and intensities and diffracted wavefront amplitudes expressed as diffraction order amplitudes using standard equations of image formation which are based on well known principles of optics. In this embodiment, a merit function is chosen that describes the gradient of the image across the edges of features at selected critical positions, such that the smallest slope at all selected positions is maximized. Such a merit function will ensure good image fidelity. But many other merit functions may also be chosen in accordance with this invention.

A set of constraints are required in order to solve an optimization problem. In this example (block 530), constraints on the projected image are imposed, for example, that critical edge positions share a common intensity, Q, to eliminate CD errors and prevent line shortening. Referring to FIG. 6, several points along the edge of the rectangular features (604, 606, and 608) may be selected, as well as points at the tips of the features (points 610 and 612) at which this constraint must be satisfied. Other constraints chosen require that the ratio of the maximum intensity generated in dark shapes to the minimum intensity in bright areas be below a development threshold, to ensure proper image topology. Points (such as locations 601, 602, 603, 614, 616, and 618) may be selected at which those constraints on intensity ratios must be satisfied. Additional constraints are imposed (block 540) to: i) enforce geometric restrictions on the size of the source regions; ii) require achievement of minimum acceptable pupil fill; iii) require adequate exposure in bright areas; and iv) prevent unwanted exposure in dark areas. The method in accordance with the present invention is not restricted to these constraints, but could include alternate or additional constraints, for example, by taking aberrations into account by approximating each source region, or subdivision of a region, as a locally centered point, or as a uniformly spaced collection of points. Using such an approximation, sample points can include points in multiple focal planes, and under multiple aberration conditions.

The merit function can then be maximized (block 550 in FIG. 5) to solve for the unknown source directions and intensities and diffraction order amplitudes using standard techniques for global optimization that are known in the art. The resulting optimized source directions, source intensities, and diffracted wave front (or diffraction order) amplitudes are then implemented within a lithographic system. The reticle mask features corresponding to the derived optimal diffraction order amplitudes may be readily determined since the relationship between diffraction pattern and reticle transmittance is linear, based on a Fourier transform. User-defined source shapes may be implemented using a number of techniques known in the art, ranging from simple apertures in the entrance pupil to customized diffractive elements.

It is known in the art that for a general merit function no fully global algorithm can be guaranteed to perform better than simple exhaustive grid search of the parameter space. However, in determining the optimized off-axis illumination directions and diffracted wavefronts, this embodiment of the present invention exploits the particular structure of the optimization problem to find a useful solution on a far more rapid basis.

Figure 5A:
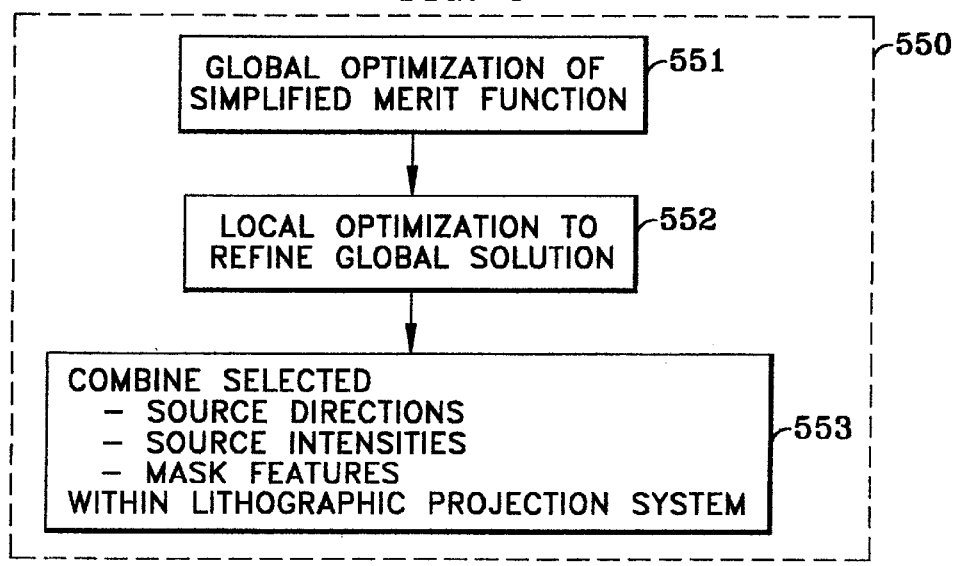
FIG. 5A illustrates a flow chart describing an embodiment of the solution of a simplified merit function in accordance with the present invention.

The difficulty in the present problem is that the merit function is not concave, which is known to imply the presence of multiple local maxima; indeed, the plane-wave orders that comprise the image are intrinsically oscillatory, giving rise to a great many local maxima in the merit function. As discussed above, an optimized solution to the merit function of this problem cannot be readily obtained with good performance from conventional starting solutions, which are based on the target wafer patterns. It is therefore important that the optimization technique achieve good global performance; robust local convergence is insufficient. To achieve global convergence (block 550) in an efficient way this embodiment of the present invention utilizes a two-part strategy illustrated in FIG. 5A to solve for an optimized wave front (resulting in a set of illumination and diffraction order amplitudes defined in the pupil plane), followed by the determination of the reticle pattern based on the optimized wave front (block 553):

1) Calculate the global optimal solution (block 551) for a simplified version of the merit function (block 510) and constraints (blocks 530 and 540).
2) Use a local optimization technique (block 552) to refine the simplified global solution of step 1 against more complete criteria.
3) Calculate a reticle pattern (included in block 553) that provides the optimized wave front determined in step 2.

As long as step 1 (block 551) provides a good starting solution, the robustness of widely available local optimization routines allows the incorporation of detailed optimality criteria in step 2 (block 552). For example, the image model used with the step 2 local optimizer can incorporate a finely spaced illumination grid with 0.02 NA steps, and a focal sampling of $0.3\lambda/NA^2$. An example of a commercially available local optimizer that can be used to obtain the step 2 solutions is the FindMinimum optimizer provided by Wolfram Research, Inc. in their Mathematica™ package, which is based on Brent's algorithm. Thus, the solution of step 2 will be fairly straightforward.

The calculation of the optimized reticle shapes, which is included in step 3 (block 553), can also be performed using a relatively simple approach, which is described more fully below, that exploits the linearity of the Fourier transform process that governs diffraction.

Figure 7:
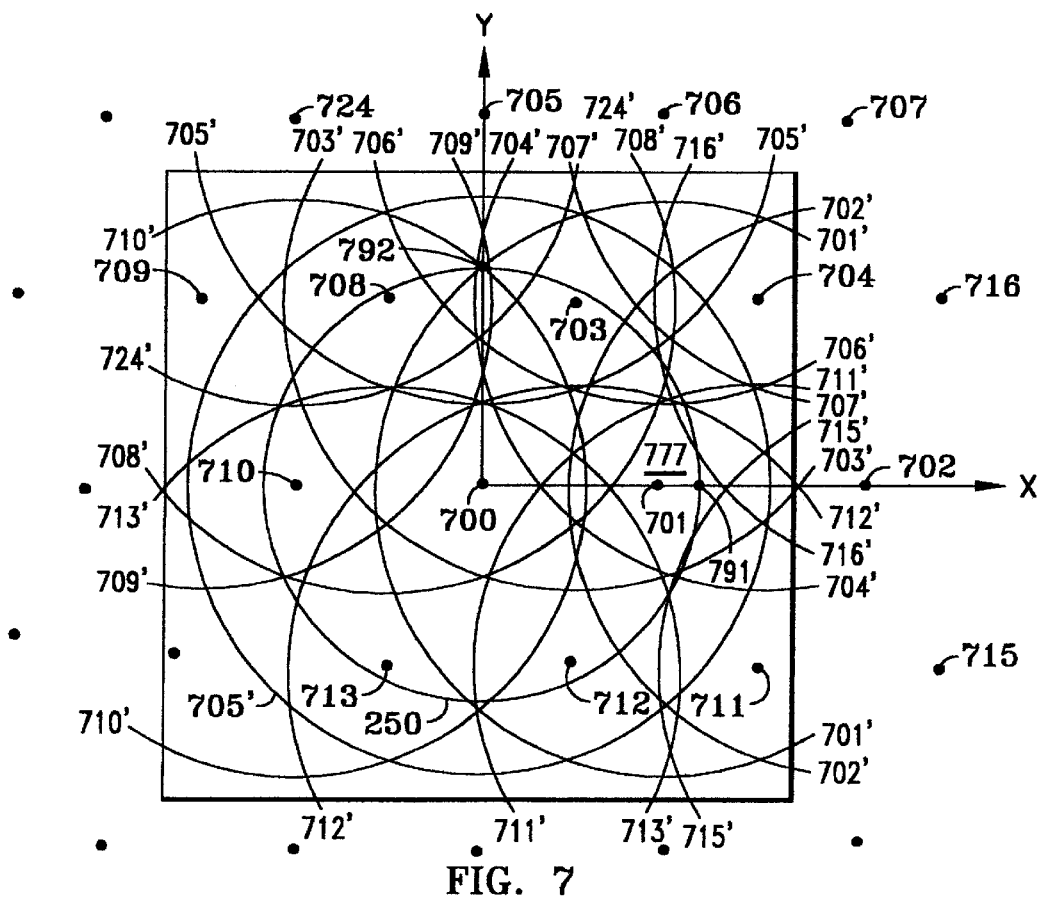
FIG. 7 illustrates diffracted orders or source directions corresponding to the pattern of FIG. 6, plotted in direction space.

In this embodiment, the global optimization of step 1 (block 551) is performed using a simplified version of the problem that considers only an aberration-free image, i.e. considerations of defocus and the fixed aberrations are deferred to step 2, and in step 1 are approximated as zero. Alternatively, aberrations and defocus can be taken into account in an approximate way during the step 1 optimization. When the target patterns are periodic, or may have periodic boundary conditions applied thereto, the aberration-free approximation allows a partitioning of the continuous space of possible source illumination directions into a fairly small number of distinct regions or zones, since two directions are equivalent (when aberrations are zero) if they direct the same set of diffraction orders into the collection pupil. FIG. 7 is a diagram similar to FIG. 3 in direction space of light diffracted into the pupil from a reticle projecting the desired pattern illustrated in FIG. 6. Alternatively, the diagram in FIG. 7 can also be viewed as representing the illumination directions incident on the reticle. The range of illumination directions for which a given order is collected by the lens pupil can be represented by circles centered on the point corresponding to the order collected from an on-axis illumination beam. For example, the interior of the circle 703' represents the range of illumination directions that provide collection of order 703. Thus, the interior of each of the regions formed by the intersections of the circles represents a range of directions that provide the same set of collected orders, and therefore the same focused image. If aberrations are neglected, the illumination can be fully represented without further loss of generality using pupil regions from separate orders that overlap within one quadrant, since illumination outside of a quadrant can be obtained by mirroring. In FIG. 7, the circles indicating the range of collectable directions for each order that overlap in the upper right hand quadrant are plotted. In this embodiment, variables representing the source intensity from different source directions are selected from overlapping pupil regions from the area circumscribed by the first quadrant (indicated by points 792 to 700 to 791) enclosed by the smaller circle 250 representing approximately 85% of NA. Within this first quadrant, there are 41 distinct areas having overlapping pupil regions. Thus, 41 distinct illumination variables were selected representing the illuminating intensity from each of the 41 different pupil regions shown in FIG. 7. For example, one variable is chosen to represent the region 777 in which only orders 700, 701, 702, 703, 704, 711, and 712 are collected. These unknown source directions are denoted as a vector variable $\vec{s}$ (of length 41 in this example). Note that each element of $\vec{s}$ represents a set of 1, 2, or 4 equally intense illuminating directions that impinge on the mask from mirrored directions.

Usually the illuminator will fill all open illumination directions with a fixed power per unit solid angle. In this case, one of the constraints on the solution (block 540) is that the source intensity from each source direction j must satisfy:

$$0 \leq s_j \leq s_{Max,j}$$

where $s_{Max,j}$ is the area of the jth illumination region in the pupil. If the source distribution is defined by diffractive source elements it is more appropriate to constrain the summed intensity.

The m,nth diffraction order of an idealized wavefront is ordinarily defined in the prior art as the amplitude $a_{m,n}$ that diffracts from the reticle in a direction $d=(m\lambda/p_x, n\lambda/p_y)$, in which $p_x$ and $p_y$ are the unit cell periodicities. As noted above, the individual collected orders are not all independent. However, in accordance with this invention it is desirable that the unknown diffracted amplitude variables represent independently adjustable components of the wavefront. Therefore, in accordance with the present invention, m and n are treated as non-negative and $a_{m,n}$ then represents a single non-redundant unknown. For a given source direction j, the amplitude at the wafer image plane $b_{m,n,j}$ that is produced by an unknown diffracted amplitude $a_{m,n}$ can therefore include the result of interference between superimposed waves from the ±m, ±n directions. In other words, the image amplitude $b_{m,n,j}$ may be given by $$e^{2\pi i\left(\frac{mx}{p_x}+\frac{ny}{p_y}\right)}, e^{2\pi i\frac{mx}{p_x}}\cos\left(\frac{ny}{p_y}\right), e^{2\pi i\frac{ny}{p_y}}\cos\left(\frac{mx}{p_x}\right), \text{ or } \cos\left(\frac{mx}{p_x}+\frac{ny}{p_y}\right), \quad [2]$$

depending on whether or not the associated negative orders in the x,y mirror directions are simultaneously captured in the pupil for illumination direction j. It is convenient to write the diffracted amplitudes $a_{m,n}$ and the wafer image amplitudes $b_{m,n,j}$ as vectors; in other words, $\vec{a}$ for the unknown diffracted order amplitudes, representing all orders that can be captured from any feasible illumination direction, and $\vec{c}_1$ and $\vec{c}_2$ for the real and imaginary parts, respectively, of the wafer image amplitude $\vec{b}$. Also, in this embodiment, it is possible to simplify the notation, since in this case the target patterns are symmetric. If the reticle were illuminated by a coherent off-axis beam (i.e. a highly non-symmetric illumination with no mirroring), the intensity produced at a point (x,y) on the wafer would be given by $$I_{Asym}(x, y) = \sum_{j=1}^{J_{Max}} \sum_{h=1}^{2} s_j (\vec{c}_{j,h} \cdot \vec{a})^2, \quad [3]$$

where an inner summation over index h (where h goes from 1 to 2) is included to separate real and imaginary parts. In this embodiment, $J_{Max}$ is equal to 41, representing the illumination directions selected from the first quadrant of the direction space diagram in FIG. 7. Thus, in order to provide proper symmetry in the image, the reticle must be illuminated symmetrically from mirrored directions, so that the total wafer-plane intensity for a symmetrical object becomes $$I(x,y)=I_{Asym}(x,y)+I_{Asym}(-x,y)+I_{Asym}(x,-y)+I_{Asym}(-x,-y). \quad [4]$$

Equation [4] can be simplified by adding an additional index q (ranging from 1 to 4) to $\vec{c}$ to distinguish the four mirrored illumination directions:

$$I(x, y) = \sum_{q=1}^{4} \sum_{j=1}^{J_{Max}} \sum_{h=1}^{2} s_j (\vec{c}_{q,j,h} \cdot \vec{a})^2, \quad [5]$$

where care must be taken to properly treat non-diagonal reticle and illumination orders.

The simplified global optimization step 1 (block 551 indicated in FIG. 5) of this embodiment can now be represented as a generalized fractional program:

$$\text{Maximize } \Psi(\vec{s}, \vec{a}) \equiv \underset{r}{\text{Min}} \left( \frac{\sum_{q=1}^{4} \sum_{j=1}^{J_{Max}} \sum_{h=1}^{2} s_j (\vec{c}_{q,j,h,r} \cdot \vec{a})(\nabla \perp \vec{c}_{q,j,h,r} \cdot \vec{a})}{\sum_{q=1}^{4} \sum_{j=1}^{J_{Max}} \sum_{h=1}^{2} s_j (\vec{c}_{q,j,h,r} \cdot \vec{a})^2} \right)$$

subject to:

$$0 \le \vec{s} \le S_{Max,j}, \sum_{j=1}^{J_{Max}} s_j \le S_{Min}, \quad [6]$$

$$\sum_{q=1}^{4} \sum_{j=1}^{J_{Max}} \sum_{h=1}^{2} s_j (\vec{c}_{q,j,h,r} \cdot \vec{a})^2 = Q, \quad (\forall r | 1 \le r \le r_{Max}),$$

$$\sum_{q=1}^{4} \sum_{j=1}^{J_{Max}} \sum_{h=1}^{2} s_j (\vec{c}_{q,j,h,u} \cdot \vec{a})^2 \ge I_{Bright} Q \quad (\forall u | 1 \le u \le u_{Max}),$$

$$\sum_{q=1}^{4} \sum_{j=1}^{J_{Max}} \sum_{h=1}^{2} s_j (\vec{c}_{q,j,h,v} \cdot \vec{a})^2 \le I_{Dark} Q \quad (\forall v | 1 \le v \le v_{Max}).$$

Figure 12:
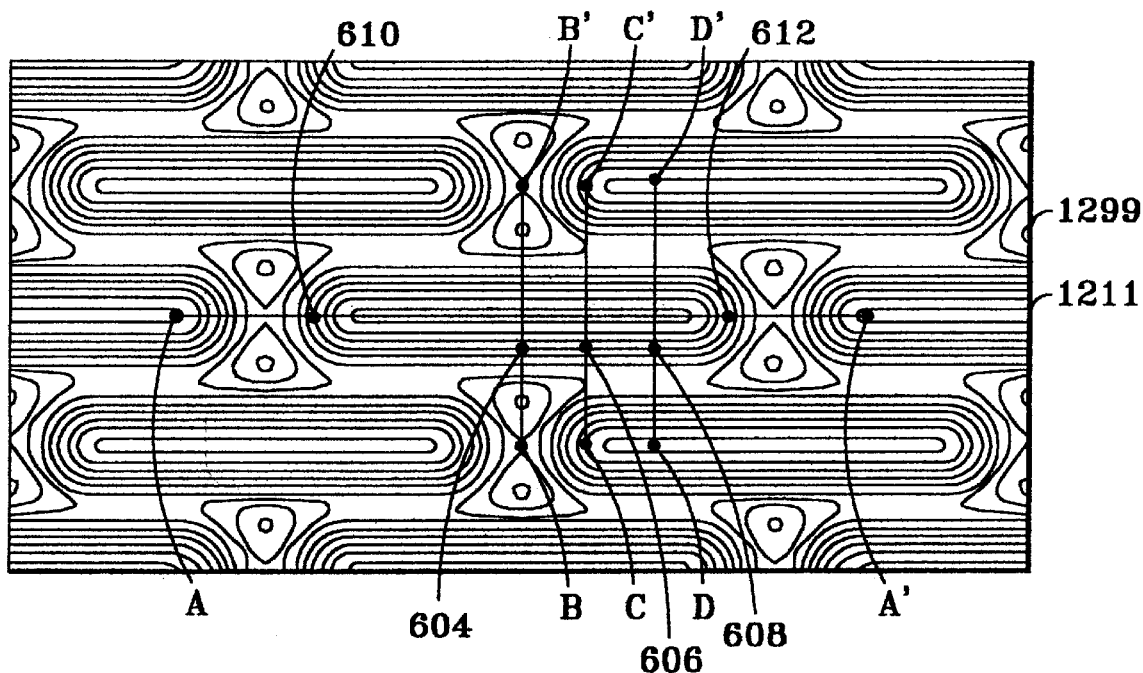
FIG. 12 illustrates intensity contours for an image obtained using the optimized source of FIG. 9 in combination with the mask of FIG. 11.

Here the index r runs over sample points $(x_r, y_r)$ along the edges of the target patterns, for example, as indicated by points 604, 606, 608, 610, and 612 in FIG. 6 and in FIG. 12.

$\nabla \perp \vec{c}$ represents the derivative of c in a direction normal to the feature edge. $\Psi$ is a merit function that represents the worst-case log-slope arising at feature edges in the image. Optimization of $\Psi$ ensures that the shallowest slope among feature edges is as steep as possible. If desired, a weighting factor can be applied to the log-slope at each position, to reflect differing CD tolerances. The indices u and v run over sample points in image regions that must be bright (for example, points 614, 616 and 618 indicated in FIG. 6) and dark (for example, points 601, 602 and 603 indicated in FIG. 6), respectively.

Figure 8:
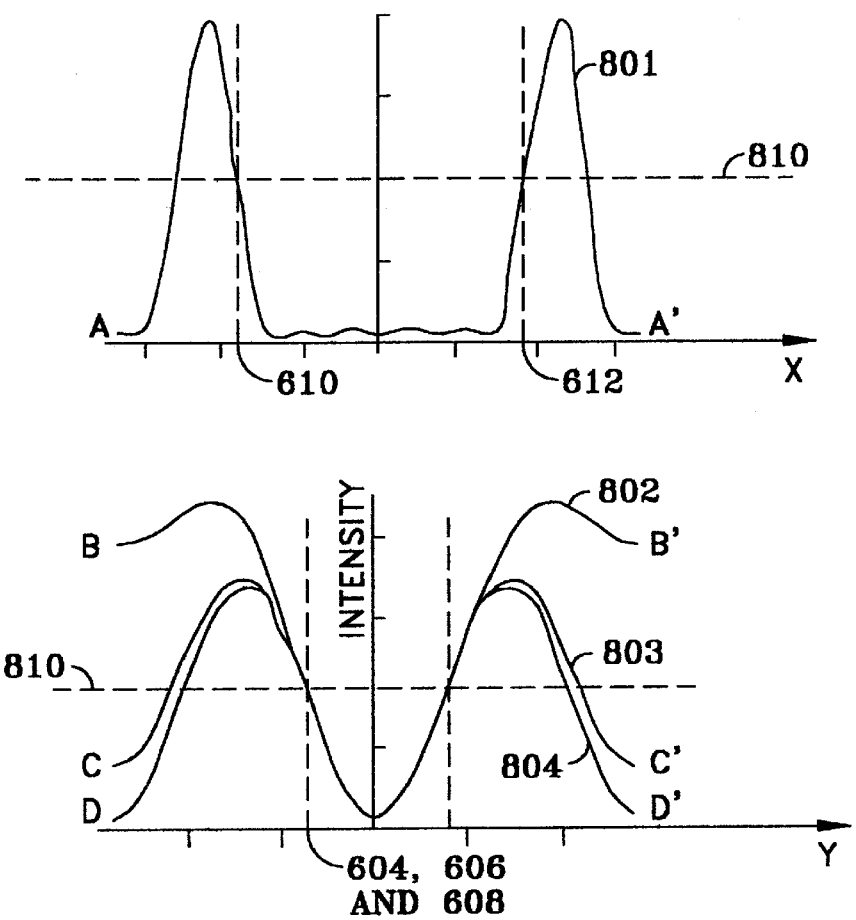
FIG. 8 plots example cross-sections of desired image intensities required to produce the pattern of FIG. 6.

Constraints are imposed (blocks 530 and 540) to: i) enforce geometric restrictions (block 540) on the size of the $s_j$ source regions, as indicated by $S_{Max, j}$; ii) require achievement of minimum acceptable pupil fill (block 540), as indicated by $S_{Min}$; iii) prevent line shortening and other CD errors in the printed pattern by forcing all edges (block 530) (for example, at points 604, 606, 608, 610 and 612 indicated in FIG. 6, FIG. 12, and FIG. 8) to print at a common (but not pre-specified) intensity Q 810 (as indicated in FIG. 8) (block 530); iv) require adequate exposure in bright areas (block 530) (for example at points 614, 616, and 618 in FIG. 6), as indicated by the term $I_{Bright} Q$; and v) prevent unwanted exposure in dark areas (block 530) (for example, at points 601, 602, and 603 in FIG. 6), as indicated by the term $I_{Dark} Q$. The equation [6] approximation restricts the distinguishable source variables to the discrete set of pupil zones defined by an aberration-free image (as in FIG. 7). However, it is possible to take aberrations into account if each source region is approximated as a locally centered point, or as a uniformly spaced collection of points within the region. This alternate approximation is used in this embodiment of the present invention, and sample points in multiple focal planes are included, and under multiple aberration conditions.

Techniques are known in the art for solving fractional optimization problems like equation [6], typically reducing them to a parametric problem in the difference between numerator and denominator. Equation [6] can also be approximated as a cubic polynomial optimization, and solved, for example by a homotopy method (illustrated below for the quadratic case). Nonetheless, equation [6] is still a fairly difficult nonlinear problem.

In this embodiment of the present invention, an approximate solution scheme for equation [6] is used which exploits the fact that two simplified variants of equation [6] are more readily solvable. First, as explained further below, if the diffracted wavefront orders a are fixed, it is possible to find the globally optimum solution for the source intensities $\vec{s}$. Second, if illuminating light is incident from only a single direction (more precisely, a single group of mirrored directions), equation [6] reduces to a nonconvex quadratic optimization problem, which can be solved more easily than the general case (see below).

In addition, one further approximation is made in this embodiment of the present invention. In all present steppers, illumination is restricted to directions that are within the NA. The various sets of collected orders associated with each of the different illumination zones are then highly non-disjoint; in fact, each consists of a different collection drawn from the same limited set of diffraction orders. The wafer interference patterns produced by different source directions may include varying numbers of mirrored copies of a given order; nonetheless, only a limited number of independent amplitude orders are collected even from a full illumination pupil. This means that the sets of collected orders produced by different illumination beams, though free from interference with one another, are not independently optimizable (although each can be weighted independently by adjusting the corresponding component of $\vec{s}$.) For example, in this embodiment, there are 41 independent illumination regions for the in-focus image, but only 8 independent orders, namely 700, 701, 702, 703, 704, 705, 706, and 716 (see FIG. 7). Note that the circle indicating the range of the 716 order only slightly intersects with the 85% NA circle 250, so that its contribution can be ignored in this example without significantly changing the solution. Suppose then that the interference pattern from a particular direction $j_1$ simultaneously provides an image that is not only suitably dark at all desired $(x_v, y_v)$ dark image points (for example, 601, 602, and 603 in FIG. 6), but is also dark at some subset $u_{1d}$ of $(x_u, y_u)$ desired bright image points (for example, at some subset of the points 614, 616, and 618 in FIG. 6), while at the same time being bright at the remaining $u_{1b}$ $(x_u, y_u)$ desired bright image points (for example, at the remaining points amongst 614, 616, and 618). Given the strong overlap between the different collected order sets, it can be assumed that it is unlikely that the interfering orders from another illumination region $j_2$ will simultaneously be bright at the subset $u_{1d}$ of the $(x_u, y_u)$ desired image bright points at which the first set of orders is dark, in addition to being dark at all $(x_v, y_v)$ dark points, and at the same time dark at some of the desired bright image points at which the first set was dark. Such a situation would require that the same limited set of orders simultaneously satisfy constraints involving two illumination directions, instead of just one (though the doubled constraints are not uniquely determined). Since such combinations are unlikely, in this embodiment it is assumed as an approximation that the optimum solution will not comprise such a system. Accordingly, only those illumination directions that individually satisfy all constraints for bright and dark regions are considered, leading to the following iterative method for solving optimization problem 550 in FIG. 5 for the reticle and illumination source:

Step 0) Initial Characterization:

a. For each of the $J_{Max}$ source directions (ranging from 1 through 41 in this embodiment), calculate a solution for diffracted mask amplitudes $\vec{a}$ that is globally optimum under simplified criteria, for example, ignoring the edge constraints and minimum pupil fill (i.e. initializing $S_{Min}$ to 0).

b. Initialize the diffracted mask amplitudes $\vec{a}$ to the best value obtained in step 0.a.

Step 1) Global Optimum of Simplified Merit Function (block 551):

a. Calculate the globally optimum source distribution $\vec{s}$ given the current values of $\vec{a}$ and $s_{Min}$.

b. Use a local algorithm to optimize $\vec{s}$ and $\vec{a}$ together including the constraints at selected image points at multiple focal planes (e.g. edge constraints, ratios of bright to dark points) (block 530).

c. Increase $S_{Min}$ by a small increment (e.g. by 5% of pupil area) and return to step 1.a, repeating until pupil is filled (block 540) or constraints (block 530) cannot be met.

Step 2) Local Optimization to Refine Global Solution (block 552):

a. Fix $S_{Min}$ at desired final level and choose corresponding solution for $\vec{s}$ and $\vec{a}$ from step 1.

b. Refine the solutions for $\vec{s}$ and $\vec{a}$ using a local optimization technique with more complex constraints (e.g. high-NA, thin-film and resist effects). Alternatively, some of these more complex constraint criteria can also be applied in step 1.

Step 3) Calculate the optimum reticle pattern (block 553) that provides the diffracted wavefront $\vec{a}$ obtained in step 2.

These steps are now considered in more detail.

In calculating the step 0.a amplitude sets $\vec{a}_j$, the constraints on equal feature bias and minimum pupil fill were deferred to step 1. As a further simplification, the optimization in step 0 can be performed against the finite difference between adjacent dark and bright points across feature edges (deferring optimization against true log-slope until step 1.

Moreover, the overall intensity scaling of the amplitudes $\vec{a}$ is arbitrary until the step 3 mask calculation. Thus, in this embodiment, the intensity at edge points such as 640, 606, 608, 610, and 612 is constrained to be greater than or equal to 1, which means that the log-slope will be maximized in a finite difference sense if the intensity at dark points on the opposite side of the edges is minimized. The step 0.a optimization problem for the jth source direction is then:

$$\Phi_j(\vec{a}) \equiv \sum_{r=1}^{R_{Max}} \sum_{q=1}^{4} \sum_{h=1}^{2} (\vec{c}_{q,j,h,r} \cdot \vec{a})^2 \qquad [7]$$

subject to:

$$\sum_{q=1}^{4} \sum_{h=1}^{2} (\vec{c}_{q,j,h,u} \cdot \vec{a})^2 \geq 1 \quad (\forall u | 1 \leq u \leq u_{Max}).$$

which can be re-written in matrix form as:

Minimize $\Phi_j(\vec{a}) = \vec{a}^T A_0 \vec{a}$ subject to:

$$\vec{a}^T A_u \vec{a} \geq 1 \quad (\forall u | 1 \leq u \leq u_{Max}). \qquad [8]$$

Even though matrices $A_0, A_1, \ldots A_{uMax}$ are positive definite, equation [8] is a nonconvex problem because the inequality constraints are lower bounds.

Nonconvex quadratically constrained quadratic programming problems such as equation [8] are currently an area of active research; they are not rapidly solvable in the general case. However, solutions can usually be obtained in practice for reasonable-sized problems. Moreover, we can exploit the special structure of equation [8] to obtain the global solution on a far more rapid basis than is possible in the general case.

The equation [8] ellipsoids share a common center. For the current embodiment of step 0.a, the search space for the optimization process is organized by using a spherical triangulation of the hypersphere which bounds the ellipsoids, with a first set of nodes for these hypertriangles (i.e. simplices) being defined by unit vectors along the principal axes of the ellipsoids. The other half of the node set is then generated by splitting these hypertriangles through the addition of a unit vector at the midpoint of each. For small to moderate-sized problems one can then refine the feasible solutions along each ray using a local algorithm. Moreover, the ellipsoids for the initial search vectors can be constructed in a space of greatly reduced dimensionality. This is because the eigenvalues of matrix $A_0$ in equation [8] must range between very small and very large amplitudes, corresponding to the wide range of intensities that can be printed at feasible values of parameter $\rho$ in equation [1]. The eigenvalues of matrix $A_0$ correspond to different average intensities over the dark sample points. It is convenient to simultaneously diagonalize $A_0$ in terms of the average intensities at both bright and dark sample points. The initial search hypersphere can then be restricted in dimensionality to the subspace spanned by the smallest eigenvalues for the dark points. Enough eigenvalues from the joint diagonalization must be included such that at least one eigenvector provides intensity greater than 1 for each of the bright sample points, where the value 1 is an arbitrary set point for minimum intensity at each bright sample point. Simultaneous diagonalization against more than two sets of basis vectors is not generally possible, and the retained eigenvalues and eigenvectors are not sufficient in themselves to account for interference between individual bright sample points. However, eigenvalue selection typically reduces the dimensionality of the search hypersphere (and therefore the dimensionality of the ellipsoids whose principal axes determine the search spherical triangles) by a factor of about 2, substantially reducing computation time. The local optimization along each ray should take place in the full vector space, or at least in a space containing a larger proportion of the dark region eigenvectors.

A second embodiment of step 0.a uses a branch-and-bound algorithm as known in the art. Here the search space is iteratively subdivided to remove regions which cannot contain the solution. Often the partitioning is based on interval arithmetic.

A third embodiment of step 0.a uses a homotopy algorithm as known in the art, in which the numerical bound for all inequality constraints except one (the uth) is changed from 1 to t, with t initialized to 0. The uth constraint then becomes active. The Lagrangian at t=0 is therefore:

$$L_j(t=0; \mu, \vec{a}) = \vec{a}^T A_0 \vec{a} - \mu(\vec{a} A_U \vec{a} - 1). \quad [9]$$

Setting to zero the derivatives with respect to each component of $\vec{a}$ we obtain the following necessary condition for a solution:

$$|B| = 0 \text{ where } B = A_0 - \mu A_U. \quad [10]$$

The solution to equation [10] is the eigenvector of $A_0$ with minimum eigenvalue in a basis in which $A_U$ is diagonalized and rescaled to the identity matrix. Parameter t is then incremented in small steps with a local optimizer applied at each step; finally equation [8] is solved when t reaches 1.

A global optimum is in principal guaranteed if a homotopy algorithm is applied to the full Lagrangian for equation [8]. Defining slack variables $\vec{y}^2$ to represent the distance of the bright sample points from the constraint boundary (in intensity units), the Lagrangian for equation [8] becomes:

$$L_j(\vec{y}, \vec{\mu}, \vec{a}) = \vec{a}^T A_0 \vec{a} + \sum_{u=1}^{u_{Max}} \mu_u(\vec{a}^T A_u \vec{a} - y_u^2 - 1). \quad [11]$$

Differentiating with respect to the variables $\vec{y}, \vec{\mu}$, and $\vec{a}$ we obtain the optimality conditions:

$$\left(A_0 + \sum_{u=1}^{u_{Max}} \mu_u A_u\right)\vec{a} = 0 \quad [12]$$

$$\vec{a}^T A_u \vec{a} - y_u^2 = 1 \quad (\forall u | 1 \le u \le u_{Max})$$

$$\mu_u y_u = 0 \quad (\forall u | 1 \le u \le u_{Max})$$

Equation [12] represents a set of simultaneous quadratic equations in the variables $\vec{y}, \vec{\mu}$ and $\vec{a}$. Simultaneous polynomial equations can be solved by homotopy, as known in the art. Solution speed is insensitive to the number of dark points; in fact a dense sampling can be advantageous because it prevents formation of an undersampled manifold containing an infinite number of solutions (which may affect robustness of the homotopy). Speed is improved when a sparse sampling of bright points is used. Since CD uniformity is only enforced in steps 1 and 2 of the present embodiment (blocks 551 and 552, bright sampling for the step 0 Lagrangian need only be maintained at a level that conforms to the sampling theorem.

Upon completion of step 0, the present embodiment has only provided what is essentially a coherent solution. The coherent image is not symmetrical, but it becomes so under fourfold illumination from the mirrored directions.

For the step 1.a global optimization of the source distribution, equation [6] is solved for $\vec{s}$, with $\vec{a}$ given. Equation [6] can be transformed into a linear problem involving a new set of variables.

$$z_0, z_1, z_2, z_3, \ldots \equiv z_0, \vec{z}, \quad [13]$$

in the linear problem:
Minimize $z_0$,
subject to:

$$z_0 + \vec{z} \cdot \sum_{q=1}^{4} \sum_{h=1}^{2} (\vec{c}_{q,j,h,r} \cdot \vec{a})(\nabla \vec{c}_{q,j,h,r} \cdot \vec{a}) \ge 0 \quad (\forall r | 1 \le r \le r_{Max}), \quad [14]$$

$$0 \le S_{Min} z_j \le S_{Max,j} \sum_{k=1}^{J_{Max}} z_k, \quad (\forall j | 1 \le j \le J_{Max}),$$

$$\vec{z} \cdot \sum_{q=1}^{4} \sum_{h=1}^{2} (\vec{c}_{q,j,h,r} \cdot \vec{a})^2 = 1 \quad (\forall r | 1 \le r \le r_{Max}),$$

$$\vec{z} \cdot \sum_{q=1}^{4} \sum_{h=1}^{2} (\vec{c}_{q,j,h,u} \cdot \vec{a})^2 = I_{Bright} \quad (\forall u | 1 \le u \le u_{Max}),$$

$$\vec{z} \cdot \sum_{q=1}^{4} \sum_{h=1}^{2} (\vec{c}_{q,j,h,v} \cdot \vec{a})^2 = I_{Dark} \quad (\forall v | 1 \le v \le v_{Max}).$$

Software for solving linear programming problems is widely available; the examples here were calculated using the LinearProgramming routine in the Mathematica™ package from Wolfram Research, Inc. After equation [14] is solved for z0 and z the step 1.a source intensities are given by:

$$\vec{s} = \frac{S_{Min} \vec{z}}{\sum_{k=1}^{J_{Max}} z_k}. \quad [15]$$

As described above, it is straightforward to carry out the step 2 local optimization (block 552) on the basis of a forward model of the image formation process.

Step 3 of the present embodiment (block 553) is the computation of the reticle which provides the optimized diffraction amplitudes $\vec{a}$. First, the set of reticle patterns are computed that provide the brightest possible image consistent with the step 2 solution for $\vec{a}$. Once a definite set of reticle patterns are determined, the layout must be refined using criteria that are well known to those skilled in the art. For example, the optimized patterns should be rendered on the mask as polygons, preferably as a set of rectangles. The rectangles can be fairly coarse, e.g. of dimension only modestly smaller than critical CDs, so long as their Fourier transform preserves the relative diffraction order amplitudes of the step 2 solution.

For the basic reticle calculation the Fourier diffraction integral is approximated over the continuous mask transmission function T(x,y) as a summation over discrete sample points, which may, for example, be defined on the grid of the mask writing tool. The 2D array of transmission sample points can be unraveled into a 1D vector of unknowns $\vec{T}$ indexed by q:

$$\int_{-p_x/2}^{p_x/2}\int_{-p_y/2}^{p_y/2} dx\,dy\,T(x,y)e^{2\pi i\left(\frac{mx}{p_x}+\frac{ny}{p_y}\right)} \cong \sum_{k=1}^{K}\sum_{l=1}^{L} T(x_k,y_l)e^{2\pi i\left(\frac{mx_k}{p_x}+\frac{ny_l}{p_y}\right)}$$
$$\equiv \sum_{g=1}^{KL} T_g b'_{g,m,n}$$
$$\equiv \sum_{g=1}^{KL} T_g b'_{g,w}.$$

[16]

In equation [16] the symbol b' has been introduced as shorthand for the exponential. Also, in the last line, the index w represents the particular values of the x,y order indices m,n that correspond to the wth captured order in the set $\vec{a}$.

Step 3 now becomes a linear programming problem:
Minimize $$-Sign\left[\sum_{w=1}^{W_{Max}} a_w\right]\sum_{g=1}^{KL}\sum_{w=1}^{W_{Max}} T_g b'_{g,w},$$

subject to:

$$\sum_{g=1}^{KL} T_g\left[\left(a_{w'}\sum_{w=1}^{W_{Max}} b'_{g,w}\right)-\left(b'_{g,w'}\sum_{w=1}^{W_{Max}} a_w\right)\right]=0 \quad (\forall w'|1\leq w'\leq W_{Max})$$ [17]

$$T_{Min} \leq T_g \leq T_{Max}.$$

where $T_g$ is mask transmission. The constraints in equation [17] force the mask Fourier orders to be in the same ratio as the components of the optimized diffraction orders $\vec{a}$ from step 2, using the order sum as a normalizing factor. A different linear combination of the orders with positive coefficients should be used if the components of $\vec{a}$ happen to sum to 0.

The present invention for obtaining an optimized source $\vec{s}$ and reticle $\vec{T}$ is not limited to the embodiments described above. Many mathematical techniques other than those described above can be brought to bear on this optimization problem, as will be clear to those skilled in the art.

Figure 9:
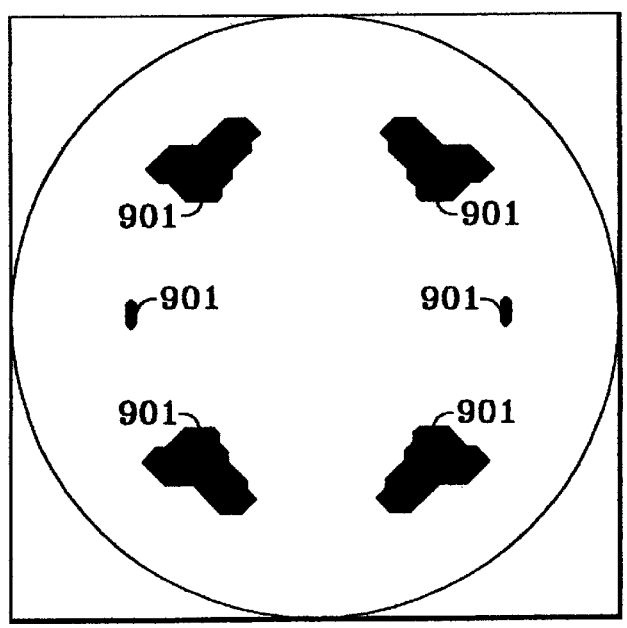
FIG. 9 illustrates an optimized source pattern obtained in accordance with the method of the present invention for the desired pattern of FIG. 6.
Figure 10:
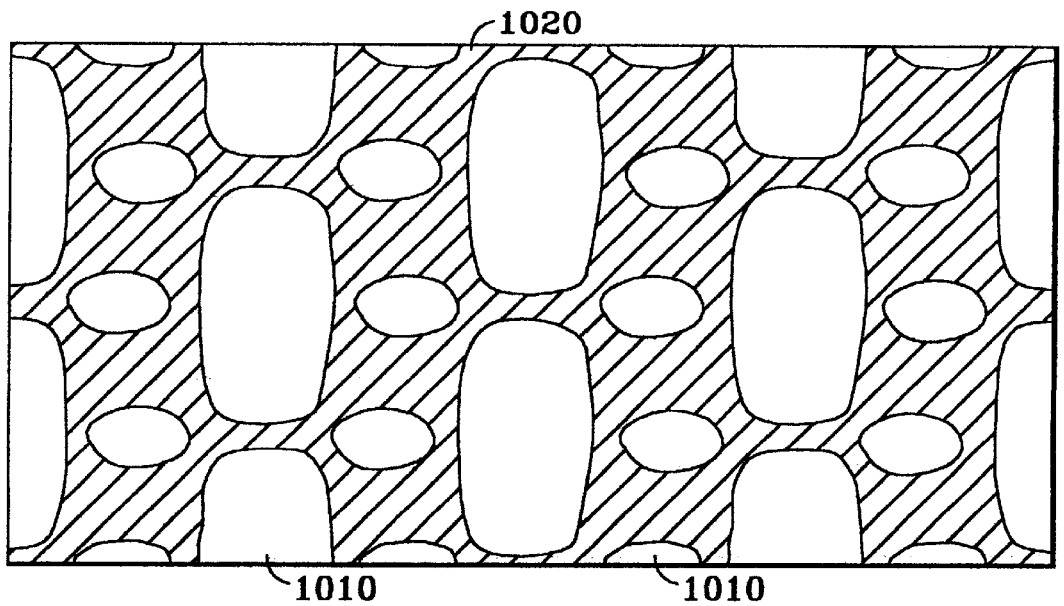
FIG. 10 illustrates an optimized mask pattern using chromeless mask technology obtained in combination with the optimized source of FIG. 9, using the method in accordance with the present invention for the desired pattern of FIG. 6.

The method in accordance with the present invention, as described above, has been embodied in a computer program. The flow diagram for this embodiment is substantially similar to that outlined in FIG. 5 and FIG. 5A, in which step 0.a is performed using a spherical triangulation of the bounding hypersphere as described above. FIG. 9 shows the optimized source illumination pattern 901 obtained for the desired pattern of FIG. 6 obtained using the present embodiment of the computer program in accordance with the present invention. FIG. 10 shows the optimized reticle obtained in the present embodiment to print the FIG. 6 pattern at a k-factor of 0.38 using chromeless mask technology as is known in the art in which silicon oxide is etched to different thickness, so that there are areas where the mask phase is 0° (1010), and other areas where the mask phase is 180° (1020). This example is for the case of F=140 nm, λ=248 nm, NA=0.68. Note that the optimized reticle pattern of FIG. 10 bears little resemblance to the FIG. 6 target shapes.

Figure 11:
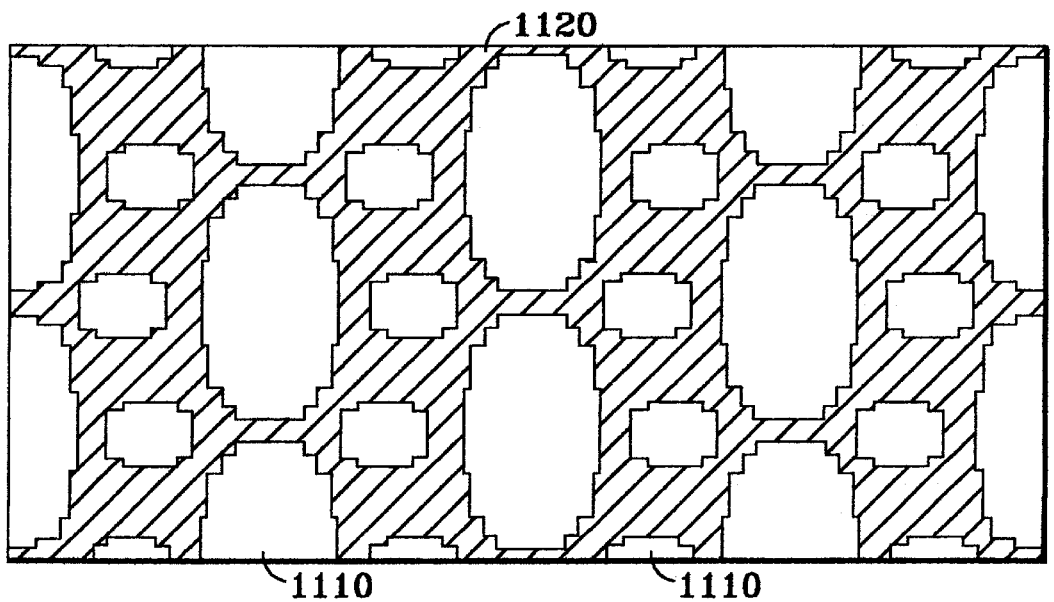
FIG. 11 illustrates a chromeless mask derived from the optimized pattern of FIG. 10, using superimposed rectangular shapes.

The curved reticle patterns of FIG. 10 are difficult to manufacture using standard technology. However, it is possible to use a collection of superimposed rectangular mask shapes ("Manhattan" geometries) to approximate the optimized diffraction pattern, although with slightly lower efficiency than with the FIG. 10 optimized shapes. FIG. 11 shows a reduction of the optimized reticle of FIG. 10 to Manhattan geometries, where the unhatched areas 1110 represent 0° mask phase and the hatched areas 1120 represent 180° mask phase. The resulting image projected to the wafer plane is shown in FIG. 12, which can be compared to the desired feature pattern in FIG. 6 where the edge points 604, 606, 608, 610, and 612 are indicated in both figures. The maximum intensity contour line 1299 on FIG. 12 is approximately at a normalized intensity of 0.45, while the minimum contour line plotted 1211 is approximately at a normalized intensity of 0.025. FIG. 8 shows a plot of the intensity along lines A-A', B-B', C-C', and D-D'. Contrast is quite high, as is the linewidth uniformity (comparing intensity at edge points 604, 606, and 608. The intensity contour through the edge points also extends from tip 610 to tip 612, indicating that line shortening in the aerial image has been eliminated. This contour represents the intensity Q in equation [6].

Figure 13:
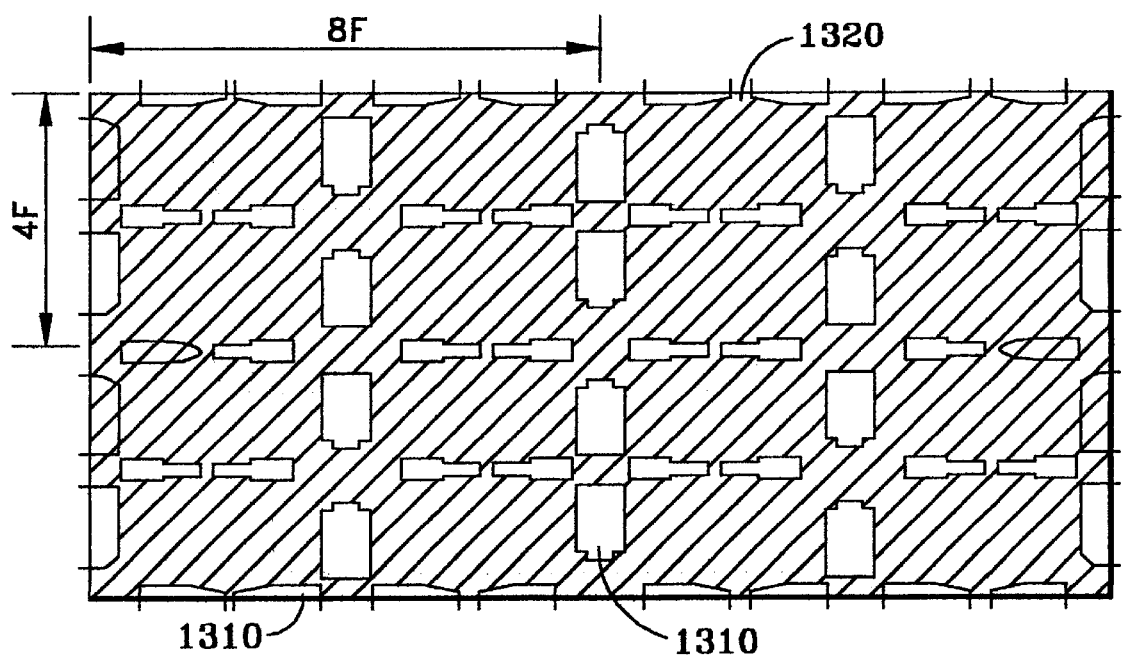
FIG. 13 illustrates a phase-shifting chrome mask using superimposed rectangular shapes derived from an optimized phase-shifting chrome pattern obtained in combination with the optimized source of FIG. 9 for the desired pattern of FIG. 6.

An alternative mask using the optimized source illumination pattern of FIG. 9 and corresponding optimized diffraction pattern for the desired FIG. 6 pattern can also be realized. FIG. 13 shows such a reticle, optimized for chrome transmission of 6%. The aerial image is substantially the same as the image in FIG. 12, except for a reduction in overall intensity, so that the maximum plotted contour 1299 is approximately at normalized intensity 0.067 while the minimum plotted contour 1211 is approximately at normalized intensity 0.0033.

Figure 14:
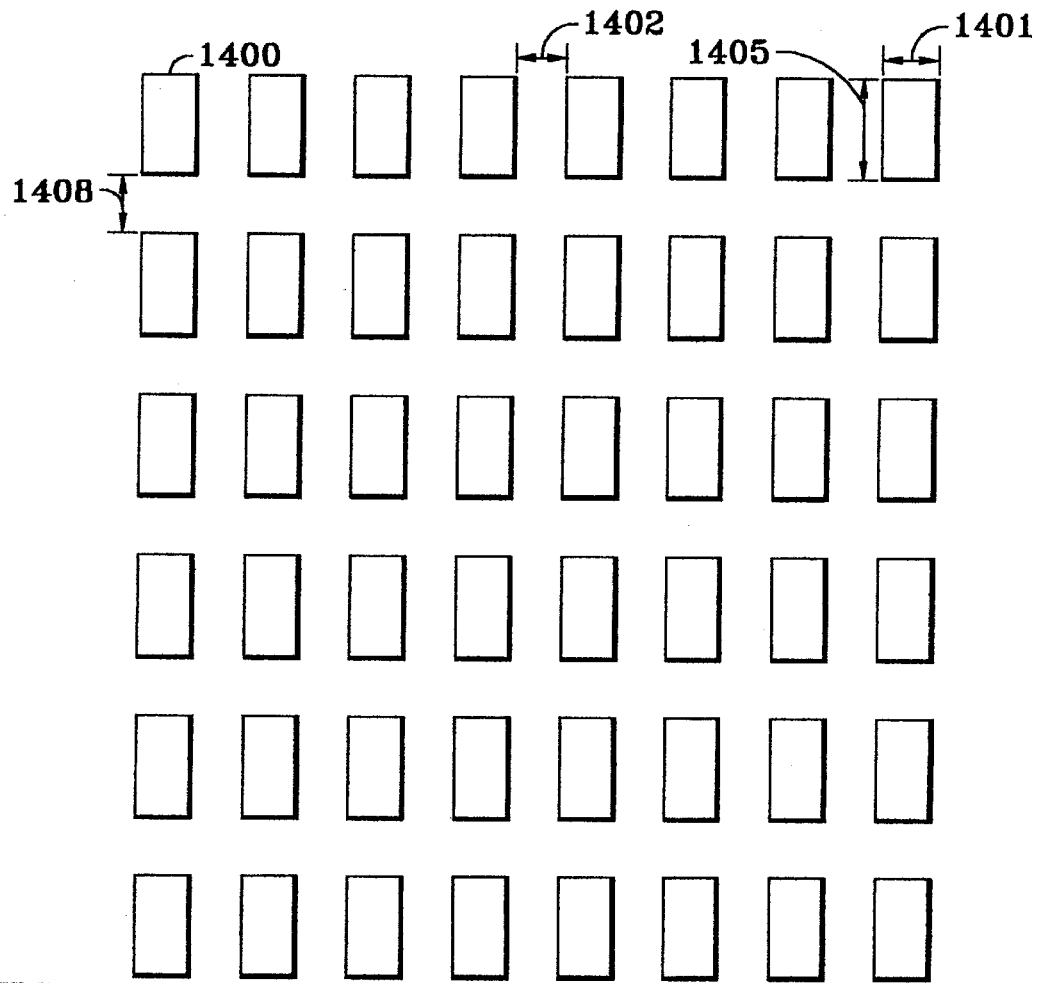
FIG. 14 illustrates a desired wafer feature pattern, as typical for a DRAM capacitor level.
Figure 15:
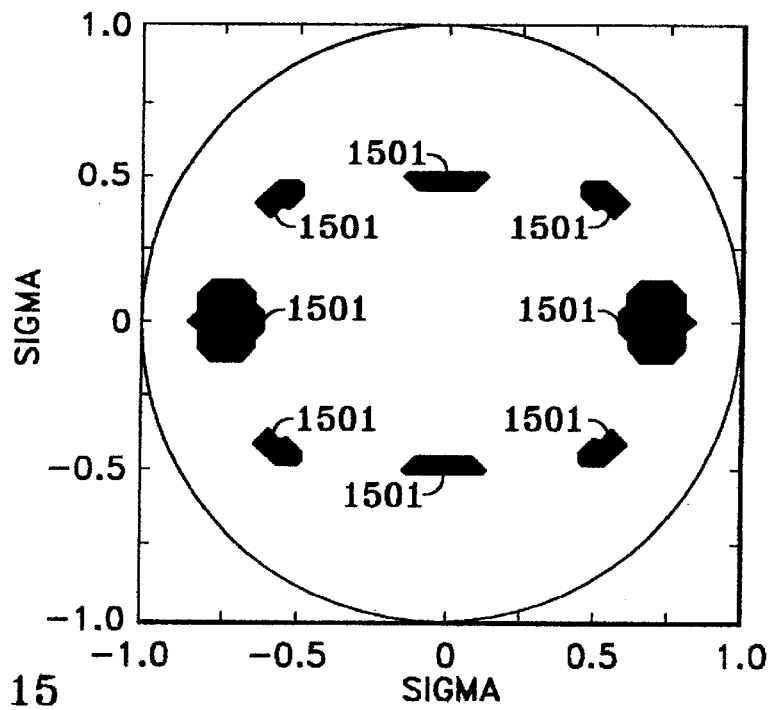
FIG. 15 illustrates the optimized source obtained using the method in accordance with the present invention for the pattern of FIG. 14.

FIG. 14 shows an example of a desired feature pattern for another embodiment of the present invention, which might represent, for example, the capacitor layout for a dynamic random access memory (DRAM) array. One critical dimension in this pattern is the width 1401 of the bright rectangles 1400, which in this example is equal to 110 nm. The horizontal spacing 1402 between features is also 110 nm, thus the horizontal period is 220 nm. The vertical period (the sum of 1405 and 1408 is 330 nm. Though difficult, it is desirable to print the rectangles with an aspect ratio (the ratio of length to width 1401 of at least 1.9:1. FIG. 15 shows the optimized illumination source pattern 1501 obtained using the method described above in accordance with the present invention for the pattern desired in FIG. 14 using λ=193 nm, NA=0.6, and CD=110 nm.

Figure 16:
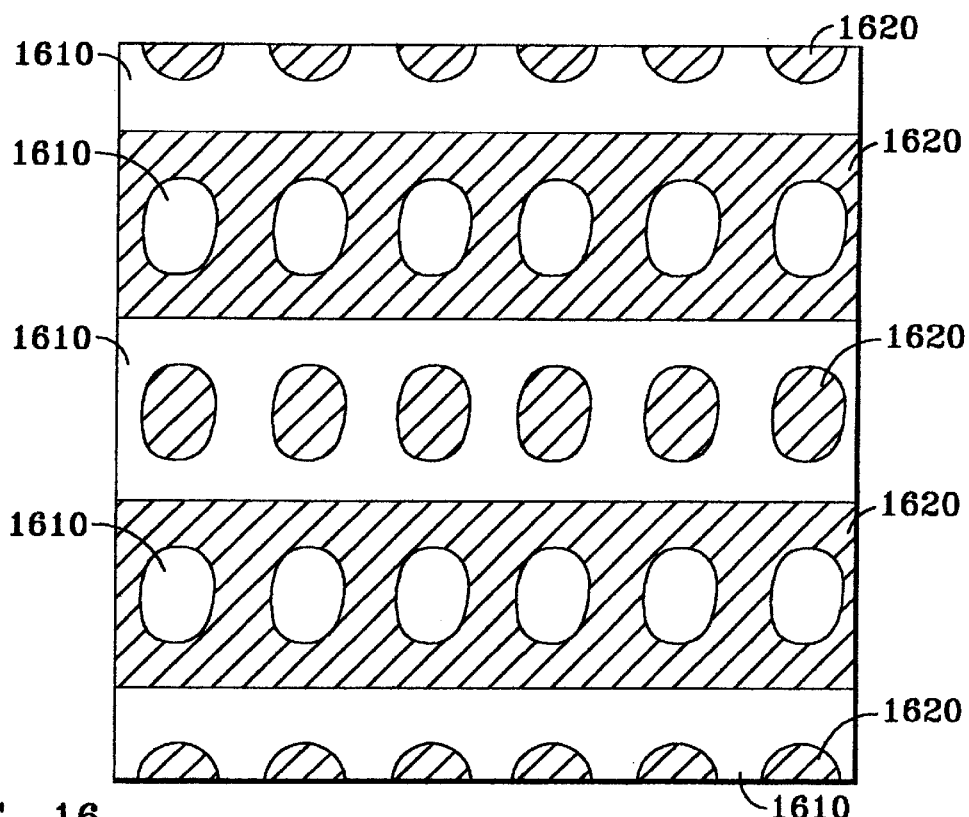
FIG. 16 illustrates the optimized mask using chromeless mask technology obtained in combination with the optimized source of FIG. 15 in accordance with the present invention.
Figure 17:
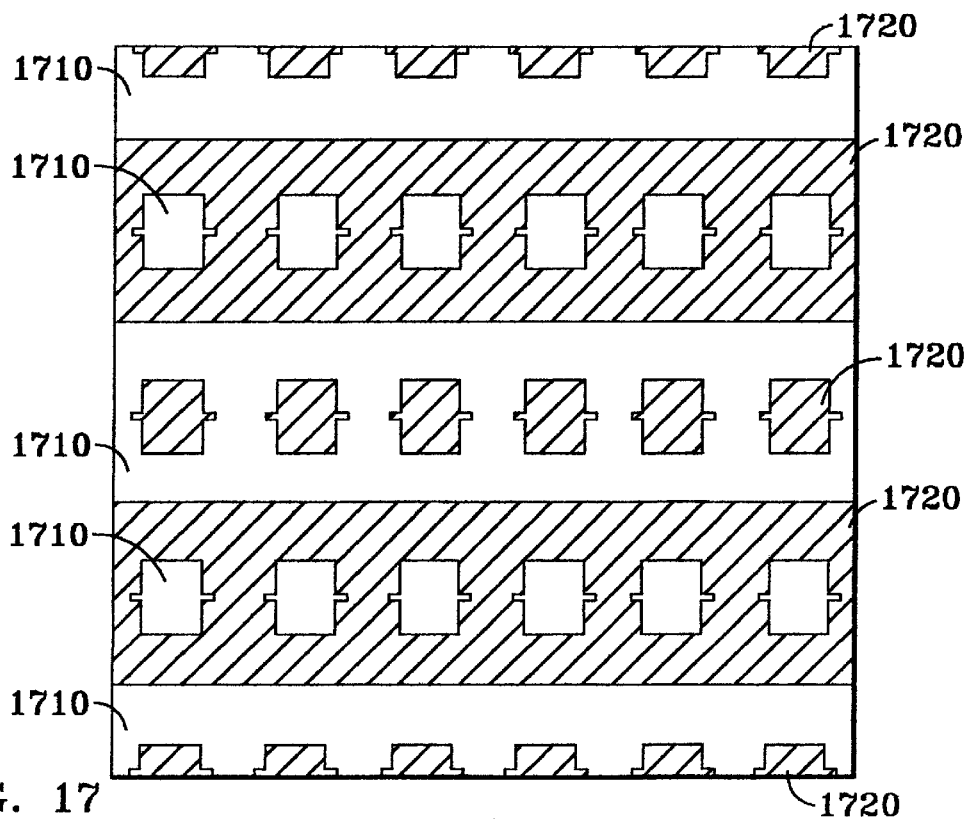
FIG. 17 illustrates an approximation of a chromeless mask derived from the optimized mask of FIG. 16 using superimposed rectangular shapes.
Figure 18:
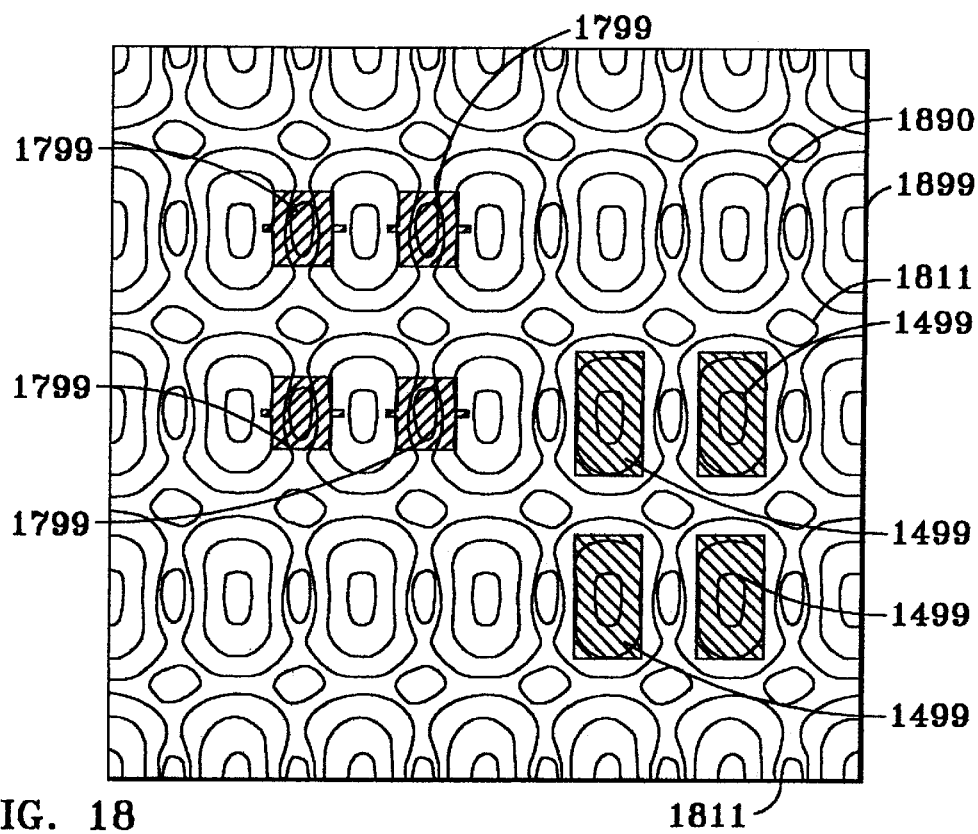
FIG. 18 illustrates intensity contours of the image obtained using the combination of the optimized source of FIG. 15 and the mask of FIG. 17, including superimposed shapes from the mask of FIG. 17 and the desired pattern from FIG. 14.

FIG. 16 shows an optimized reticle using chromeless mask technology where unhatched areas 1610 correspond to 0° mask phase areas and hatched areas 1620 correspond to 180° mask phase areas. FIG. 17 shows a reduction of the FIG. 16 reticle to Manhattan geometries where the unhatched areas 1710 correspond to 0° mask phase areas and hatched areas 1720 correspond to 180° mask phase areas. The resultant image is shown in FIG. 18, in which the maximum plotted contour 1899 is approximately at normalized intensity 0.60 and the minimum plotted contour 1811 is approximately at normalized intensity 0.05. The bright image features are centered on maximum contour 1899, as illustrated by shapes 1499 from FIG. 14 that are also superimposed on FIG. 18. Again, unlike a conventional mask, the reticle optimized for off-axis illumination bears little resemblance to the desired wafer pattern. Note that the bright image features at 1499 actually fall in between the vaguely brick-like shapes 1799 from the FIG. 17 mask. In other words, the direct resemblance of the reticle shapes 1799 to the target image features 1499 is coincidental. The contours 1890 have the desired aspect ratio of 1.9:1 corresponding to the aspect ratio of desired rectangular features 1499.

Figure 19:
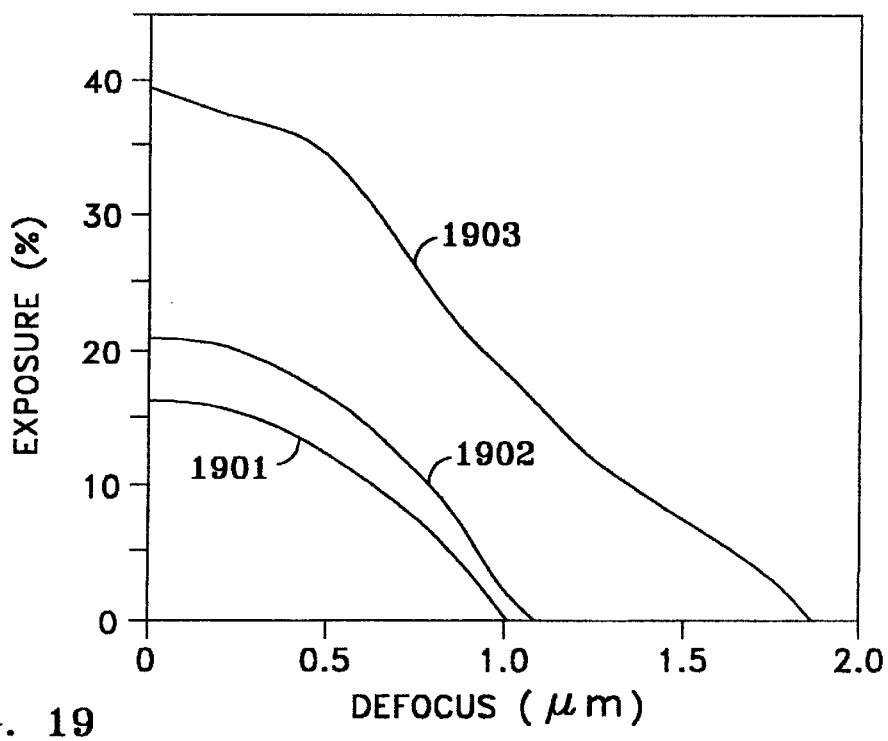
FIG. 19 illustrates the process window obtained using the optimized source of FIG. 15 and mask of FIG. 17 in accordance with the present invention, compared to process windows obtained using prior art source and mask combinations.

FIG. 19 plots the process window attainable with the FIG. 15 and FIG. 17 optimized source and reticle. The optimized curve 1903 resulting from the source and reticle of the present embodiment is obtained by calculating aerial images at multiple focal positions, and then calculating the common exposure range within which both feature length and feature width are held within tolerance throughout each plotted focal range (the horizontal axis coordinate). Tolerances of ±30 nm and ±15 nm are used for the length and width, respectively. For comparison to prior art, a similar curve 1901 is plotted for an image obtained by prior art image enhancement techniques, in which the reticle uses brick shapes corresponding to the desired image features that are fabricated in attenuating chrome and imaged using annular source illumination.

The integrated area under process window curves like FIG. 19 serves as a useful figure of merit as known in the art for lithographic images (see, for example, R. A. Ferguson, R. M. Marino, and T. A. Brunner, "Data analysis methods for evaluating lithographic performance," J. Vac. Sci. Technol. B 15, no.6 (1997), p. 2387). By this metric the process window for the optimized source and reticle of the present invention is 4 times larger than with the conventional prior art image enhancement processes. Moreover, at the nominal focus and exposure the optimized process achieves the desired aspect ratio of 1.9:1 with no foreshortening, while with the conventional process, the aspect ratio at nominal exposure and focus is only met within ±30 nm length and ±15 nm width tolerances.

It is difficult to avoid line shortening with prior art enhancement techniques; thus the process window with the conventional prior art technique can be improved if one is willing to compromise the aspect ratio. The process window obtained with an attenuating phase shift mask and annular source that are adjusted to print at 1.8:1 aspect ratio is shown by the curve 1902. Though tolerances ease under the relaxed ground rule, the process window for the optimized source and reticle remains larger than with the conventional enhancement technique by a factor of about 2.5, and thus, no compromises need be made in the aspect ratio when using image enhancement methods in accordance with the present invention.

The optimized reticle patterns obtained in accordance with the present invention, whether using chromeless material (for example, FIG. 10 or FIG. 11 corresponding to the pattern in FIG. 6, and FIG. 16 or FIG. 17 corresponding to the FIG. 14 pattern) or phase-shifting chrome (for example, FIG. 13 corresponding to the pattern in FIG. 6), bear little resemblance to the corresponding desired feature patterns. Recall that if the desired feature patterns such as FIG. 6 or FIG. 14 are used directly to form a mask pattern as in the prior art, the resulting mask patterns would need to be lengthened to improve aspect ratio (i.e. prevent line shortening), yet would need to be shortened to improve contrast. Such conflicted shapes are missing from the optimized reticles (FIGS. 10, 11, 13, 16, or 17 obtained using the method in accordance with the present invention. Prior art reticles (which attempt to conform to the desired image pattern) suffer from problems including leakage of light from bright features into dark image areas which degrades contrast. By contrast, reticles in accordance with the present invention, avoid these problems, and also avoid the need for subsequent trimming exposures.

Another novel aspect of the particular reticles shown in FIG. 17 is that the dark boundaries between adjacent bright features of the image are printed as the result of destructive interference from phase-shifted mask openings. In other words, phase cancellation suppresses the image light midway between the bright features, forming dark features. It should be noted that such phase cancellation action is in no way prescribed or even identified in the method shown in FIG. 5. according to the present invention, and such action does not take place in all solutions produced by the present invention. However, such action is found to occur in some optimal reticles such as obtained using the optimizing process of the present invention as outlined in FIG. 5 (such as the FIG. 17 reticle). Thus, high quality lithographic images can sometimes be obtained by shaping phase shifted mask openings to print the dark separations between bright patterns via destructive interference. If the mask uses phase-shift chrome, these canceling shapes can be openings in the chrome. If the mask uses opaque chrome, the phase canceling openings can be etched into the substrate beneath the chrome, to a depth that puts them 180° out of phase with other openings that produce the bright features. Alternatively, phase-shifted openings in a chromeless mask can be used. The phase canceling openings need not be used to print all dark features in the image; some dark features can instead be printed using such known methods as opaque chrome or phase edges.

The FIG. 5 method in accordance with the present invention will not necessarily provide masks of this kind, and it is not necessary to use the FIG. 5 process to design such masks. Instead, specific dimensions for the phase canceling features of such masks can be obtained using design processes already known in the art. For example, one can use standard image simulation methods to calculate the width of dark image features that are produced by a set of trial phase canceling mask features. The dimensions of these mask features can then be adjusted to correct any departures in the widths of the image features from the desired values. A rule of thumb for choosing initial dimensions for the starting set of such mask features is that their area be approximately 70% that of the corresponding dark regions in the image.

There is a technique (U.S. Pat. No. 5,328,785 entitled "High Power Phase Masks for Imaging Systems" issued to Smith et al., hereinafter referred to as the Smith patent) which prints dark image areas using a phase grating composed of alternating bars that are 180° out of phase with one another. However, this does not involve the use of phase cancellation to actively suppress the image light between features. Instead, the grating of the Smith patent works by diffracting all light away from the lens pupil. To achieve this, the phase shifted openings must occupy about 50% of the dark area, and the pitch of the openings must be very fine, for example less than 0.67λ/NA for the case of illumination with 50% radial pupil fill. As far as image formation is concerned, the light distribution produced by the gratings of Smith et al. is the same as would be produced by ordinary opaque chrome; both block light from entering the lens. Whether conventional chrome or the gratings of the Smith patent are used, the limited resolution of available lithography lenses causes light from adjacent bright features to spill over into the intervening dark area, distorting the printed shape and degrading contrast. (The grating has the advantage of being absorption-free, which prevents mask damage in certain applications.)

Masks are known in the art that use phase shifted chrome in dark areas of the pattern (for example, T. Terasawa et al., "Imaging characteristics of multi-phase-shifting and half-tone phase-shifting masks," Japanese J. Appl. Phys. Part 1, Vol. 30, no.11B (1991), pages 2991–2997, cited above). Phase shift in prior art masks is used to steepen the transitions at the edges of bright features. However, the transmission of conventional phase-shifted chrome is fairly low, usually less than about 10% that of open areas, and the chrome prints as dark in the image not because of destructive interference, but simply because it blocks light in the same way as does ordinary chrome (though not quite as completely). Another difference between the above-described masks of the present invention and the prior art masks of Terasawa et al. is that chrome is not physically opened in these prior art masks to print dark regions; instead, mask openings are used to print bright image regions. Yet another difference is that the chrome used in these prior art masks does not constitute a designed set of shapes in the mask; instead, it is simply a continuous surround (i.e. background) for the designed open shapes that print as bright image regions.

Masks such as shown in FIG. 17 of this aspect of the present invention, employ phase shifted openings of designed shape to form dark separations between bright image features by means of destructive interference to achieve superior resolution in comparison to a prior art chrome mask or to a grating mask of the Smith patent. Resolution is improved because the phase-shifted light is deliberately diffracted into the lens pupil by the phase canceling features, rather than being diffracted away as in the Smith patent. This phase-shifted light cancels some of the above-mentioned spillover light, improving resolution and contrast. The phase-shifted mask openings are laid out periodically only if the desired image features are periodic. In the FIG. 17 example the y image pitch (660 nm) is about 2.05λ/NA; this is large enough that light from the phase-shifted openings is collected by the lithographic lens, allowing it to produce dark features in the image by destructive interference.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for printing a desired pattern on a semiconductor wafer having a photoactive material thereon, the method comprising the steps of:

providing a diffraction relationship for determining at least one diffracted amplitude diffracted by a reticle having at least one diffraction parameter when said reticle is exposed to illumination energy from an illumination source having at least one source parameter;

providing a merit function for computing a merit value of an image pattern on a wafer plane as a function of variables including said at least one diffracted amplitude;

selecting at least one constraint on at least one of said variables;

determining an optimal value of said at least one diffracted amplitude so that said merit function attains a merit value that is optimized in accordance with said at least one constraint;

selecting a combination of at least one selected source parameter and at least one selected diffraction parameter to produce said optimal value of said at least one diffracted amplitude in accordance with said diffraction relationship;

forming an optimal reticle having a diffractive feature with said at least one selected diffraction parameter;

illuminating said optimal reticle with illumination energy from an illumination source having said at least one selected source parameter, so that said illumination energy is diffracted by said diffractive feature and projected through a lens aperture to form an optimal image pattern on the wafer plane in accordance with said at least one constraint;

exposing the photoactive material to said optimal image pattern; and developing said exposed photoactive material to form the desired pattern.

2. The method of claim 1 wherein said at least one source parameter comprises both a source direction and a source intensity.

3. The method of claim 1 further comprising forming an optimal reticle having at least one diffractive feature with said at least one selected diffraction parameter so that said optimal value of said at least one diffracted amplitude is produced when said diffractive feature is illuminated by an illumination source having said at least one selected source parameter.

4. The method of claim 1 wherein said at least one diffracted amplitude further comprises a first amplitude collected within a first quadrant of the lens aperture and a second amplitude collected within a second quadrant of the lens aperture, wherein said first amplitude is selected independently of said second amplitude.

5. The method of claim 1 wherein said at least one constraint includes a preselected image intensity at a selected point of the desired image pattern corresponding to an edge of an element of the desired image pattern.

6. The method of claim 1 wherein said merit function comprises a derivative of image intensity at a selected point on the wafer plane corresponding to an edge of an element of the desired image pattern, said derivative having a direction normal to said edge.

7. A method for printing an integrated circuit pattern on a semiconductor wafer having a photoactive material thereon, the method comprising the steps of:

providing a desired wafer feature pattern having at least one wafer feature element;
deriving a merit function describing a relationship between an illumination source, a reticle, and an image, said source having at least one source parameter, said reticle having at least one diffractive feature, and said image having at least one image intensity;
selecting at least one constraint in relation to said desired wafer feature pattern that said at least one image intensity must satisfy;
selecting a combination of said at least one source parameter and said at least one diffractive feature so that said merit function is optimized in accordance with said at least one constraint;
illuminating said reticle with illumination energy from said illumination source, so that said illumination energy is diffracted by said reticle and projected through a lens aperture to form said at least one image intensity on the wafer;
exposing the photoactive material to said at least one image intensity; and
developing said exposed photoactive material to form a printed feature,
so that said printed feature conforms with said at least one wafer feature element of said desired wafer feature pattern in accordance with said at least one constraint, and wherein said at least one source parameter comprises a source direction having a source amplitude, wherein illumination from said source direction on said at least one diffractive feature produces at least one diffracted amplitude, and said step of selecting a combination further comprises
selecting a plurality of source directions having diffracted orders overlapping in direction space in accordance with said desired wafer feature pattern;
deriving a simplified function from said merit function;
computing a diffracted amplitude corresponding to each of said plurality of source directions at selected source amplitudes and selecting a first optimized combination of computed diffracted amplitudes, source directions and source amplitudes so that said simplified function is globally optimized;
selecting a final optimized combination of at least one source direction, at least one source amplitude and at least one diffracted amplitude so that said merit function is locally optimized using said first optimized combination as a starting solution, and so that said merit function is locally optimized in accordance with said at least one constraint; and
forming said selected at least one diffractive feature so that said at least one selected diffracted amplitude is produced when said selected at least one diffractive feature is illuminated by said source from said selected at least one source direction.

8. The method of claim 7 wherein the step of forming said selected at least one diffractive feature further comprises approximating said diffractive feature using superimposed rectangular shapes.

9. A method for selecting a combination of source illumination parameters and diffraction mask features for projecting energy through a lens aperture to form a desired image pattern on a wafer plane, the method comprising the steps of:
providing a diffraction relationship for determining at least one diffracted amplitude diffracted by a reticle having at least one diffraction parameter when said reticle is exposed to illumination energy from an illumination source having at least one source parameter;
providing a merit function for computing a merit value of the desired image pattern on the wafer plane as a function of variables including said at least one diffracted amplitude;
selecting at least one constraint on at least one of said variables;
determining an optimal value of said at least one diffracted amplitude so that said merit function attains a merit value that is optimized in accordance with said at least one constraint; and
selecting a combination of at least one selected source parameter and at least one selected diffraction parameter to produce said optimal value of said at least one diffracted amplitude in accordance with said diffraction relationship.

10. The method of claim 9 wherein said at least one source parameter comprises both a source direction and a source intensity.

11. The method of claim 9 further comprising
designing a reticle having a diffractive feature with said at least one selected diffraction parameter so that said optimal value of said at least one diffracted amplitude is produced when said diffractive feature is illuminated b[] an illumination source having said at least one selected source parameter.

12. The method of claim 9 wherein said at least one diffracted amplitude further comprises a first amplitude collected within a first quadrant of the lens aperture and a second amplitude collected within a second quadrant of the lens aperture, wherein said first amplitude is selected independently of said second amplitude.

13. The method of claim 9 wherein said at least one constraint includes a preselected image intensity at a selected point of the desired image pattern corresponding to an edge of an element of the desired image pattern.

14. The method of claim 9 wherein said merit function comprises a derivative of image intensity at a selected point on the wafer plane corresponding to an edge of an element of the desired image pattern, said derivative having a direction normal to said edge.

15. A method for selecting a combination of source illumination parameters and diffraction mask features for projecting energy through a lens aperture to form an image pattern on a wafer, the method comprising the steps of:
providing a desired wafer feature pattern having at least one wafer feature element;
deriving a merit function describing a relationship between an illumination source, a reticle, and the image pattern, said source having at least one source parameter, said reticle having at least one diffractive feature, and said image pattern having at least one image intensity;
selecting at least one constraint in relation to said desired wafer feature pattern that said at least one image intensity must satisfy; and
selecting a combination of said at least one source parameter and said at least one diffractive feature,
so that said merit function is optimized in accordance with said at least one constraint, and wherein said at least one source parameter comprises a source direction having a source amplitude, wherein illumination from said source direction on said at least one diffractive feature produces at least one diffracted amplitude and said step of selecting a combination further comprises:

selecting a plurality of source directions having diffracted orders overlapping in direction space in accordance with said desired wafer feature pattern;

deriving a simplified function from said merit function;

computing a computed diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one source direction, at least one source amplitude and at least one diffracted amplitude so that said merit function is locally optimized using said first optimized combination as a starting solution, and so that said merit function is locally optimized in accordance with said at least one constraint; and forming said selected at least one diffractive feature so that said at least one selected diffracted amplitude is produced when said selected at least one diffractive feature is illuminated by said source from said selected at least one source direction.

16. A computer program product for selecting a combination of source illumination parameters and diffraction mask features for projecting energy through a lens aperture to form a desired image, the computer program product comprising computer readable instructions for causing a computer to perform the method steps of:

storing a desired image pattern on a wafer plane;

storing a diffraction relationship for determining at least one diffracted amplitude diffracted by a reticle having at least one diffraction parameter when said reticle is exposed to illumination energy from an illumination source having at least one source parameter;

storing a merit function for computing a merit value of an image pattern on the wafer plane as a function of variables including said at least one diffracted amplitude;

storing at least one constraint on at least one of said variables;

determining an optimal value of said at least one diffracted amplitude so that said merit function attains a merit value that is optimized in accordance with said at least one constraint; and selecting a combination of at least one selected source parameter and at least one selected diffraction parameter to produce said optimal value of said at least one diffracted amplitude in accordance with said diffraction relationship.

17. The computer program product of claim 16 wherein said at least one source parameter comprises both a source direction and a source intensity.

18. The computer program product of claim 16 wherein said method steps further comprise computing characteristics of a reticle having a diffractive feature with said at least one selected diffraction parameter so that said optimal value of said at least one diffracted amplitude is produced when said diffractive feature illuminated by an illumination source having said at least one selected source parameter.

19. The method of claim 16 said at least one diffracted amplitude further comprises a first amplitude collected within a first quadrant of the lens aperture and a second amplitude collected within a second quadrant of the lens aperture, wherein said first amplitude is selected independently of said second amplitude.

20. The computer program product of claim 16 wherein said at least one constraint includes a preselected image intensity at a selected point of the desired image pattern corresponding to an edge of an element of the desired image pattern.

21. The computer program product of claim 16 wherein said merit function comprises a derivative of image intensity at a selected point on the wafer plane corresponding to an edge of an element of the desired image pattern, said derivative having a direction normal to said edge.

22. A computer program product for selecting a combination of source illumination parameters and diffraction mask features for projecting energy through a lens aperture to form a desired image, the computer program product comprising computer readable instructions for causing a computer to perform a method having the steps of:

storing a desired wafer pattern having at least one wafer feature element;

storing a merit function describing a relationship between an illumination source, a reticle, and an image pattern, said source having at least one source parameter, said reticle having at least one diffractive feature, and said image pattern having at least one image intensity;

storing at least one constraint in relation to said desired wafer feature pattern that said at least one image intensity must satisfy; and selecting a combination of said at least one source parameter and said at least one diffractive feature, so that said merit function is optimized in accordance with said at least one constraint, and wherein said at least one source parameter comprises a source direction having a source amplitude, wherein illumination from said source direction on said at least one diffractive feature produces at least one diffracted amplitude and said step of selecting a combination further comprises:

storing a plurality of source directions having diffracted orders overlapping in direction space in accordance with said desired feature pattern;

computing a simplified function derived from said merit function;

computing a diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one source direction, at least one source amplitude and at least one diffracted amplitude so that said merit function is locally optimized using said first optimized combination as a starting solution, and so that said merit function is locally optimized in accordance with said at least one constraint; and computing characteristics of said selected at least one diffractive feature so that said at least one selected diffracted amplitude is produced when said selected at least one diffractive feature is illuminated by said source from said selected at least one source direction.

23. The method of claim 22 wherein the step of computing characteristics of said selected at least one diffractive feature further comprises approximating said diffractive feature using superimposed rectangular shapes.

24. A machine readable storage medium having stored therein a program of instructions executable by the machine to perform method steps for selecting a combination of source illumination parameters and diffraction mask features for projecting energy through a lens aperture to form a desired image pattern on a wafer plane, said method steps comprising:

storing a desired image pattern;

storing a diffraction relationship for determining at least one diffracted amplitude diffracted by a reticle having at least one diffraction parameter when said reticle is exposed to illumination energy from an illumination source having at least one source parameter;

storing a merit function for computing a merit value of an image pattern on the wafer plane as a function of variables including said at least one diffracted amplitude;

storing at least one constraint on at least one of said variables;

determining an optimal value of said at least one diffracted amplitude so that said merit function attains a merit value that is optimized in accordance with said at least one constraint; and selecting a combination of at least one selected source parameter and at least one selected diffraction parameter to produce said optimal value of said at least one diffracted amplitude in accordance with said diffraction relationship.

25. The machine readable storage medium of claim 24 wherein said at least one source parameter comprises both a source direction and a source intensity.

26. The machine readable storage medium of claim 24 wherein said method steps further comprise computing characteristics of a reticle having a diffractive feature with said at least one selected diffraction parameter so that said optimal value of said at least one diffracted amplitude is produced when said diffractive feature is illuminated by an illumination source having said at least one selected source parameter.

27. The method of claim 24 wherein said at least one diffracted amplitude further comprises a first amplitude collected within a first quadrant of the lens aperture and a second amplitude collected within a second quadrant of the lens aperture, wherein said first amplitude is selected independently of said second amplitude.

28. A machine readable storage medium having stored therein a program of instructions executable by the machine to perform method steps for selecting a combination of source illumination parameters and diffraction mask features for projecting energy through a lens aperture to form a desired image, said method steps comprising:

storing a desired wafer feature pattern having at least one wafer feature element;

storing instructions for causing a computer to compute a merit function describing a relationship between an illumination source, a reticle, and an image pattern, said source having at least one source parameter, said reticle having at least one diffractive feature, and said image pattern having at least one image intensity;

storing at least one constraint in relation to said desired feature pattern that said at least one image intensity must satisfy; and selecting a combination of said at least one source parameter and said at least one diffractive feature, so that said merit function is optimized in accordance with said at least one constraint, and wherein the step of selecting a combination further comprises approximating said diffractive feature using superimposed rectangular shapes.

29. The machine readable storage medium of claim 24 wherein said at least one constraint includes a preselected image intensity at a selected point of the desired image pattern corresponding to an edge of an element of the desired image pattern.

30. The machine readable storage medium of claim 24 wherein said merit function comprises a derivative of image intensity at a selected point of the desired image pattern corresponding to an edge of an element of the desired image pattern, said derivative having a direction normal to said edge.

31. A machine readable storage medium having stored therein a program of instructions executable by the machine to perform method steps for selecting a combination of source illumination parameters and diffraction mask features for projecting energy through a lens aperture to form a desired image, said method steps comprising:

storing a desired wafer feature pattern having at least one wafer feature element;

storing instructions for causing a computer to compute a merit function describing a relationship between an illumination source, a reticle, and an image pattern, said source having at least one source parameter, said reticle having at least one diffractive feature, and said image pattern having at least one image intensity;

storing at least one constraint in relation to said desired feature pattern that said at least one image intensity must satisfy; and selecting a combination of said at least one source parameter and said at least one diffractive feature, so that said merit function is optimized in accordance with said at least one constraint, and wherein said at least one source parameter comprises a source direction having a source amplitude, wherein illumination from said source direction on said at least one diffractive feature produces at least one diffracted amplitude and said step of selecting a combination further comprises:

selecting a plurality of source directions having diffracted orders overlapping in direction space in accordance with said desired wafer feature pattern;

deriving a simplified function from said merit function;

computing a diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one source direction, at least one source amplitude and at least one diffracted amplitude so that said merit function is locally optimized using said first optimized combination as a starting solution, and so that said merit function is locally optimized in accordance with said at least one constraint; and designing said selected at least one diffractive feature so that said selected at least one diffracted amplitude is produced when said selected at least one diffractive feature is illuminated by said source from said selected at least one source direction.

32. A machine readable storage medium having stored therein a program of instructions executable by the machine to perform method steps for selecting a combination of source illumination parameters and diffraction mask features for projecting energy through a lens aperture to form a desired image, said method steps comprising:

storing a desired wafer feature pattern having at least one wafer feature element;

storing instructions for causing a computer to compute a merit function describing a relationship between an illumination source, a reticle, and an image pattern, said source having at least one source parameter, said reticle having at least one diffractive feature, and said image pattern having at least one image intensity;

storing at least one constraint in relation to said desired feature pattern that said at least one image intensity must satisfy; and selecting a combination of said at least one source parameter and said at least one diffractive feature, so that said merit function is optimized in accordance with said at least one constraint, and wherein the step of selecting a combination further comprises approximating said selected at least one diffractive feature using superimposed rectangular shapes.

33. A lithographic system for printing a desired wafer feature pattern on a semiconductor wafer including a photoactive material, the system comprising:

an illumination source having at least one source parameter;

a reticle having at least one diffraction parameter; and a lens;

said illumination source, said reticle and said lens being arranged so that said illumination source illuminates said reticle so as to produce a plurality of diffracted amplitudes and said plurality of diffracted amplitudes are collected by said lens and projected to form a image on the semiconductor wafer and wherein said at least one source parameter and said at least one diffraction parameter are selected so that a merit function, expressed as a function of variables including said plurality of diffracted amplitudes, attains an optimal merit value and wherein said merit function is optimized in accordance with at least one constraint on at least one of said variables, so that exposing the photoactive material to said image and developing said exposed photoactive material forms a printed pattern that substantially conforms with the desired wafer feature pattern.

34. A reticle for diffracting illumination energy to form a desired image pattern having a pattern of intensities, the desired image pattern having a desired bright area in which the intensities within the desired bright area exceed a predetermined bright threshold and having a desired dark area in which the intensities within the desired dark area are less than a predetermined dark threshold, the reticle comprising a pattern of phase-shifting material arranged so that the desired dark area is formed completely by destructive interference of diffracted illumination energy diffracted by said pattern of phase-shifting material.

35. The reticle of claim 34 wherein said phase-shifting material comprises phase-shifting chrome material that transmits at least some illumination energy.

36. The method of claim 1 wherein said at least one source parameter comprises a source direction having a source amplitude, and said step of selecting a combination further comprises:

selecting a plurality of source directions having diffracted orders overlapping in direction space in accordance with the desired image pattern;

deriving a simplified function from said merit function;

computing a diffracted amplitude corresponding to each of said plurality of source directions having source amplitudes and selecting a first optimized combination of computed diffracted amplitudes, source directions and source amplitudes so that said simplified function is globally optimized;

selecting a final optimized combination of at least one selected source direction having a selected source amplitude and at least one selected diffracted amplitude so that said merit function is locally optimized using said first optimized combination as a starting solution, and so that said merit function is locally optimized in accordance with said at least one constraint; and forming said diffractive feature so that said at least one selected diffracted amplitude is produced when said diffractive feature is illuminated by an illumination source having said at least one selected source direction having said selected source amplitude.

37. The method of claim 1 wherein the step of forming said optimal reticle further comprises approximating said diffractive feature using superimposed rectangular shapes.

38. The method of claim 9 wherein said at least one source parameter comprises a source direction having a source amplitude and said step of selecting a combination further comprises:

selecting a plurality of source directions having diffracted orders overlapping in direction space in accordance with the desired image pattern;

deriving a simplified function from said merit function;

computing a computed diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one selected source direction having a selected source amplitude and at least one selected diffracted amplitude so that said merit function is locally optimized using said first optimized combination as a starting solution, and so that said merit function is locally optimized in accordance with said at least one constraint; and forming a reticle having a diffractive feature with said at least one selected diffraction parameter so that said at least one selected diffracted amplitude is produced when said diffractive feature is illuminated by an illumination source having said at least one selected source direction having said selected source amplitude.

39. The computer program product of claim 16 wherein said at least one source parameter comprises a source direction having a source amplitude, and said step of selecting a combination further comprises:

storing a plurality of source directions having diffracted orders overlapping in direction space in accordance with said desired feature pattern;

computing a simplified function derived from said merit function;

computing a diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one selected source direction having a selected source amplitude and at least one selected diffracted amplitude so that said merit function is locally optimized using said first optimized combination as a starting solution, and so that said merit function is locally optimized in accordance with said at least one constraint; and computing characteristics of a reticle having a diffractive feature with said at least one selected diffraction parameter so that said at least one selected diffracted amplitude is produced when said diffractive feature is illuminated by an illumination source having said at least one selected source direction having said selected source amplitude.

40. The method of claim 16 wherein the computer readable instructions for computing characteristics of said optimal reticle further comprises approximating said diffractive feature using superimposed rectangular shapes.

41. The machine readable storage medium of claim 24 wherein said at least one source parameter comprises a source direction having a source amplitude, and said step of selecting a combination further comprises:

selecting a plurality of source directions having diffracted orders overlapping in direction space in accordance with said desired wafer feature pattern;

deriving a simplified function from said merit function;

computing a diffracted amplitude corresponding to each of said plurality of source directions at selected source amplitudes and selecting a first optimized combination of computed diffracted amplitudes, source directions and source amplitudes so that said simplified function is globally optimized;

selecting a final optimized combination of at least one selected source direction having a selected source amplitude and at least one selected diffracted amplitude so that said merit function is locally optimized using said first optimized combination as a starting solution, and so that said merit function is locally optimized in accordance with said at least one constraint; and computing characteristics of said optimal reticle having said diffractive feature so that said at least one selected diffracted amplitude is produced when said diffractive feature is illuminated by an illumination source having said at least one selected source direction having said selected source amplitude.

42. The machine readable storage medium of claim 26 wherein the step of computing characteristics of a reticle further comprises approximating said diffractive feature using superimposed rectangular shapes.

43. The method of claim 11 wherein the step of designing a reticle further comprises approximating said diffractive feature using superimposed rectangular shapes.

\* \* \* \* \*